(12) United States Patent
Tanaka

(10) Patent No.: US 11,130,334 B2
(45) Date of Patent: Sep. 28, 2021

(54) ACTUATOR DEVICE INCLUDING ACTUATOR AND WIRING MEMBER

(71) Applicant: BROTHER KOGYO KABUSHIKI KAISHA, Nagoya (JP)

(72) Inventor: Taiki Tanaka, Yokkaichi (JP)

(73) Assignee: BROTHER KOGYO KABUSHIKI KAISHA, Nagoya (JP)

( * ) Notice: Subject to any disclaimer, the term of this patent is extended or adjusted under 35 U.S.C. 154(b) by 0 days.

(21) Appl. No.: 16/553,274

(22) Filed: Aug. 28, 2019

(65) Prior Publication Data

US 2019/0381797 A1 Dec. 19, 2019

Related U.S. Application Data

(63) Continuation of application No. PCT/JP2018/010562, filed on Mar. 16, 2018.

(30) Foreign Application Priority Data

Mar. 29, 2017 (JP) .............................. JP2017-064727

(51) Int. Cl.
*B41J 2/14* (2006.01)
*H01L 41/047* (2006.01)

(52) U.S. Cl.
CPC ...... *B41J 2/14233* (2013.01); *H01L 41/0475* (2013.01); *B41J 2002/14241* (2013.01);
(Continued)

(58) Field of Classification Search
CPC .......... B41J 2/14233; B41J 2002/14241; B41J 2002/14419; B41J 2002/14491; H01L 41/0475; H01L 27/20; H01L 41/0973
See application file for complete search history.

(56) References Cited

U.S. PATENT DOCUMENTS

2011/0205270 A1 8/2011 Miyata
2011/0234707 A1 9/2011 Gao
(Continued)

FOREIGN PATENT DOCUMENTS

JP 2011-167956 A 9/2011
JP 2011-194783 A 10/2011
(Continued)

OTHER PUBLICATIONS

International Preliminary Report on Patentability dated Oct. 1, 2019, together with the Written Opinion received in related International Application No. PCT/JP2018/010562.
(Continued)

*Primary Examiner* — Geoffrey S Mruk
(74) *Attorney, Agent, or Firm* — Scully, Scott, Murphy & Presser, P.C.

(57) ABSTRACT

An actuator device includes an actuator, and a wiring member. The actuator includes: driving elements each including a first electrode and a second electrode, the second electrodes being electrically connected to each other to provide a common electrode; first individual wires each extending from each of the first electrodes in a second direction; first individual contacts each provided at a distal end portion of each of the first individual wires; and a first common contact extending from the common electrode and positioned on an extension line extending in the second direction from at least one of the first individual contacts. The wiring member is connected to the first individual contacts and the first common contact.

25 Claims, 22 Drawing Sheets

(52) U.S. Cl.
CPC .............. *B41J 2002/14419* (2013.01); *B41J 2002/14491* (2013.01)

(56) References Cited

U.S. PATENT DOCUMENTS

| | | |
|---|---|---|
| 2013/0083132 A1 | 4/2013 | Tanaka et al. |
| 2013/0084199 A1* | 4/2013 | Tanaka ................ F04B 43/046 417/413.2 |
| 2014/0132677 A1 | 5/2014 | Kondo |
| 2016/0121609 A1 | 5/2016 | Owaki |
| 2016/0243830 A1 | 8/2016 | Naito et al. |

FOREIGN PATENT DOCUMENTS

| | | |
|---|---|---|
| JP | 2013-77755 A | 4/2013 |
| JP | 2014-94524 A | 5/2014 |
| JP | 2016-088084 A | 5/2016 |

OTHER PUBLICATIONS

International Search Report and Written Opinion dated Jun. 6, 2018 issued in PCT/JP2018/010562.
Japanese Notice of Reasons for Refusal dated Apr. 27, 2021 received in Japanese Patent Application No. 2017-064727, together with an English-language translation.

* cited by examiner

CONVEYING DIRECTION
FRONT ← REAR

ACTUATOR DEVICE INCLUDING ACTUATOR AND WIRING MEMBER

CROSS REFERENCE TO RELATED APPLICATION

This is a continuation application of International Application No. PCT/JP2018/010562 filed Mar. 16, 2018 which claims priority from Japanese Patent Application No. 2017-064727 filed Mar. 29, 2017. The entire contents of the earlier applications are incorporated herein by reference.

TECHNICAL FIELD

The present disclosure relates to an actuator device.

BACKGROUND

In a piezoelectric element described in Japanese Patent Application Publication No. 2011-194783, a plurality of first electrodes are arrayed in a first direction on a lower surface of a piezoelectric layer, and a second electrode extending across the plurality of first electrodes is disposed on an upper surface of the piezoelectric layer. Each of the first electrodes is connected to an individual lead wire that is led out to one side of the first electrode in a second direction orthogonal to the first direction. Further, a wire electrode is disposed on an upper surface of a vibrating plate provided in the piezoelectric element. The wire electrode is connected to both ends of the second electrode in the first direction. Further, common lead wires extending in the second direction are disposed between neighboring individual lead wires and connect the second electrode to the wire electrode, thereby suppressing variation in potential at different points in the second electrode.

SUMMARY

However, since the common lead wires are positioned between neighboring individual lead wires in the example of Japanese Patent Application Publication No. 2011-194783 described above, it is difficult to reduce the gaps between neighboring individual lead wires (the gaps between neighboring first electrodes), resulting in a larger piezoelectric element.

In view of the foregoing, it is an object of the disclosure to provide an actuator device that can suppress variation in potential at different points in a common electrode used commonly for a plurality of driving elements, without requiring large gaps between neighboring driving elements.

In order to attain the above and other objects, according to one aspect, the disclosure provides an actuator device including: an actuator; and a wiring member. The actuator includes: a plurality of driving elements; a plurality of first individual wires; a plurality of first individual contacts; and a first common contact. The plurality of driving elements each includes a first electrode and a second electrode. The plurality of driving elements is arrayed in a first direction on a plane. The second electrodes are electrically connected to each other to provide a common electrode. The plurality of first individual wires each extends from each of the first electrodes in a second direction crossing the first direction and in parallel to the plane. The plurality of first individual wires is arrayed in the first direction at intervals between neighboring first individual wires. The plurality of first individual contacts is each provided at a distal end portion of each of the plurality of first individual wires. The first common contact extends from the common electrode and positioned on an extension line extending in the second direction from at least one of the plurality of first individual contacts. The wiring member is connected to the plurality of first individual contacts and the first common contact.

According to another aspect, the disclosure also provides an actuator device including an actuator, and a wiring member. The actuator includes: a plurality of driving elements; a plurality of first individual wires; a plurality of first individual contacts; and a plurality of first common contacts. The plurality of driving elements each includes a first electrode and a second electrode. The plurality of driving elements includes a first row of the driving elements and a second row of the driving elements. The first row and the second row extend in a first direction on a plane and are juxtaposed with each other in a second direction crossing the first direction and in parallel to the plane. The second electrodes of the driving elements constituting the first row are electrically connected to each other to provide a first common electrode. The second electrodes of the driving elements constituting the second row are electrically connected to each other to provide a second common electrode. The plurality of first individual wires includes: a first wire row of the first individual wires extending in the first direction, the first individual wires in the first wire row being arrayed in the first direction at intervals between neighboring first individual wires and each extending in the second direction from each of the first electrodes of the driving elements constituting the first row toward the second row; and a second wire row of the first individual wires extending in the first direction, the first individual wires in the second wire row being arrayed in the first direction at intervals between neighboring first individual wires and each extending in the second direction from each of the first electrodes of the driving elements constituting the second row toward the first row. The plurality of first individual contacts includes: a first contact row of the first individual contacts each provided at a distal end portion of each of the first individual wires in the first wire row; and a second contact row of the first individual contacts each provided at a distal end portion of each of the first individual wires in the second wire row. The plurality of first common contacts each extends from the first common electrode toward the second row and is positioned on an extension line extending in the second direction from one of the first individual contacts in the second contact row. The wiring member is connected to the plurality of first individual contacts and the plurality of first common contacts.

BRIEF DESCRIPTION OF THE DRAWINGS

The particular features and advantages of the embodiment(s) as well as other objects will become apparent from the following description taken in connection with the accompanying drawings, in which.

DETAILED DESCRIPTION

Figure 1:
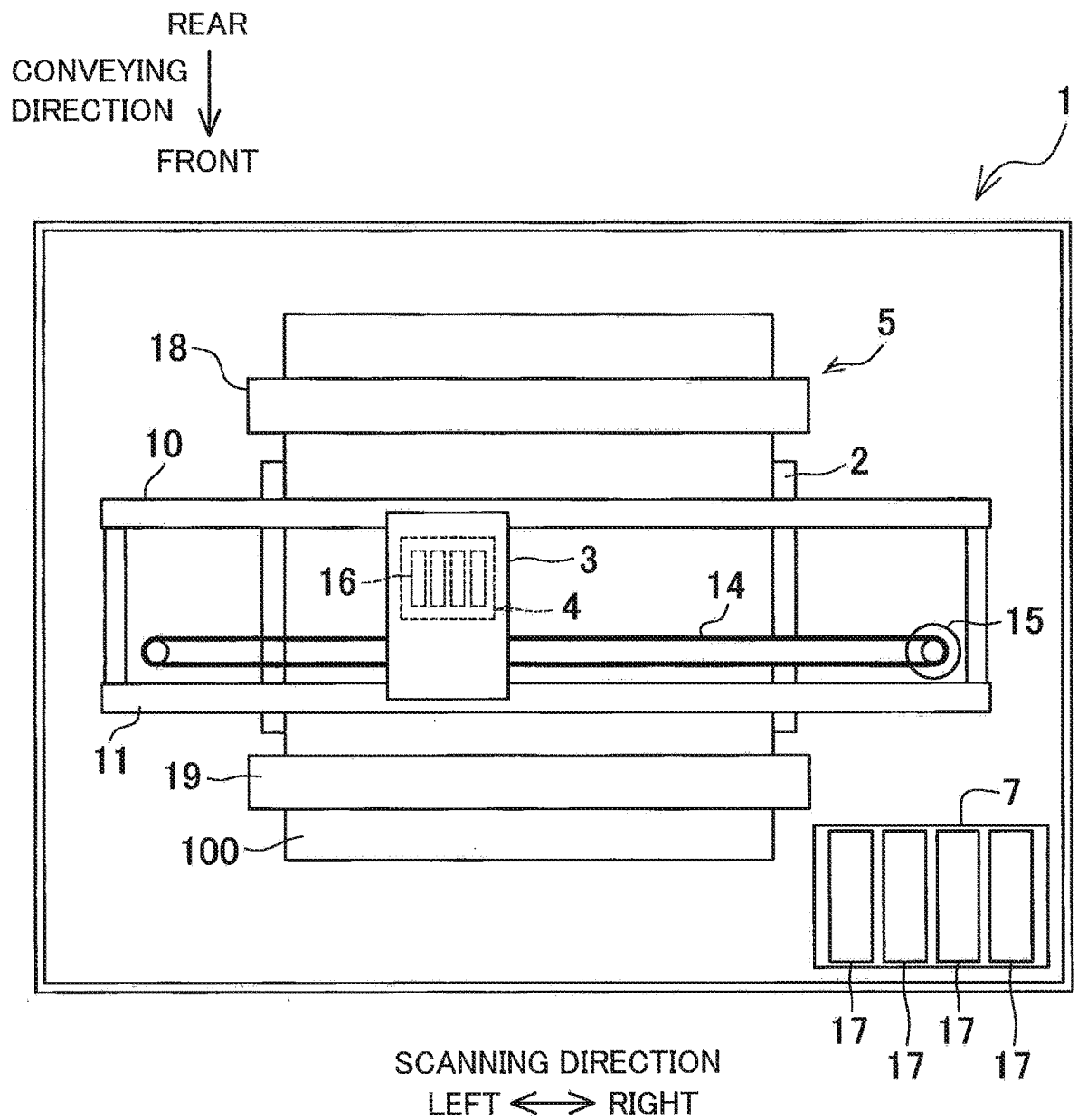
FIG. 1 is a schematic view of a printer 1 according to one embodiment of the disclosure.

An inkjet printer 1 provided with an actuator device according to one embodiment will be described with reference to the accompanying drawings, wherein like parts and components are designated by the same reference numerals to avoid duplicating description.

<Overall Structure of Inkjet Printer>

As illustrated in FIG. 1, the inkjet printer 1 includes a platen 2, a carriage 3, an inkjet head 4, and a conveying mechanism 5. In the following description, a direction in which a recording sheet 100 is conveyed in FIG. 1 will be defined as a front-rear direction (an example of a first direction and an example of a third direction) relative to the inkjet printer 1. Additionally, a widthwise direction of the recording sheet 100 will be defined as a left-right direction (an example of a second direction and an example of a fourth direction) relative to the inkjet printer 1. Further, a direction perpendicular to a surface of the drawing in FIG. 1 that is orthogonal to the front-rear direction and the left-right direction will be defined as a top-bottom direction relative to the inkjet printer 1.

The recording sheet 100 as an example of a recording medium is supported on a top surface of the platen 2. The carriage 3 is configured to reciprocate in the left-right direction (hereinafter also referred to as a "scanning direction") along two guide rails 10 and 11 within an area opposing the platen 2. An endless belt 14 is coupled to the carriage 3. The belt 14 is driven by a carriage drive motor 15 for moving the carriage 3 in the scanning direction.

The inkjet head 4 is mounted on the carriage 3. The inkjet head 4 moves together with the carriage 3 in the scanning direction. The inkjet head 4 is provided with four head units 16 juxtaposed in the scanning direction. The four head units 16 are connected to a cartridge holder 7 by individual tubes (not illustrated). Ink cartridges 17 storing ink in four different colors (black, yellow, cyan, and magenta) are mounted in the cartridge holder 7.

Each head unit 16 has a plurality of nozzles 36 (see FIGS. 4 and 5) formed in a bottom surface thereof (i.e. a surface of the head unit 16 on a far side of FIG. 1). The head units 16 eject ink supplied from the ink cartridges 17 toward the recording sheet 100 supported on the platen 2 through the plurality of nozzles 36. The head units 16 will be described later in detail.

The conveying mechanism 5 includes two conveying rollers 18 and 19 disposed on opposite sides of the platen 2 in the front-rear direction. The conveying rollers 18 and 19 convey the recording sheet 100 supported on the platen 2 in a frontward direction (hereinafter also referred to as a "conveying direction").

<Detailed Description of Head Units>

Next, the structure of the head units 16 of the inkjet head 4 will be described. Since each of the head units 16 has the same structure, only one of the four head units 16 will be described below.

As illustrated in FIGS. 2 through 5, the head unit 16 includes a first channel member 21, a second channel member 22, a nozzle plate 23, a piezoelectric actuator 24, a chip-on-film (COF) 25, a protective member 26, and an ink supply member 27. Note that the COF 25 has been omitted from the drawings in FIGS. 2 through 4. Further, the combination of the piezoelectric actuator 24 and the COF 25 in the present embodiment corresponds to the actuator device.

<First Channel Member, Second Channel Member, and Nozzle Plate>

The first channel member 21, the second channel member 22, and the nozzle plate 23 each has a rectangular planar shape. The first channel member 21, the second channel member 22, and the nozzle plate 23 are stacked in the top-bottom direction from top to bottom in the order given. The first channel member 21 is provided by a single-crystal silicon substrate for purposes of forming piezoelectric elements 41 described later (an example of driving elements) on the first channel member 21 through a deposition process.

A plurality of pressure chambers 28 is formed in the first channel member 21. The plurality of pressure chambers 28 is arranged within a horizontal plane. Each pressure chamber 28 has a rectangular planar shape that is elongated in the scanning direction. The plurality of pressure chambers 28 is configured of two pressure chamber rows juxtaposed with each other in the scanning direction, with pressure chambers 28 in each row arrayed in the conveying direction. Further, the pressure chambers 28 in one row are arranged at different positions in the conveying direction from the pressure chambers 28 in the other row. More specifically, if the pitch of the pressure chambers 28 in each row is P, then the pressure chambers 28 in the left row are offset from the pressure chambers 28 in the right row by P/2 in the conveying direction.

Figure 5:
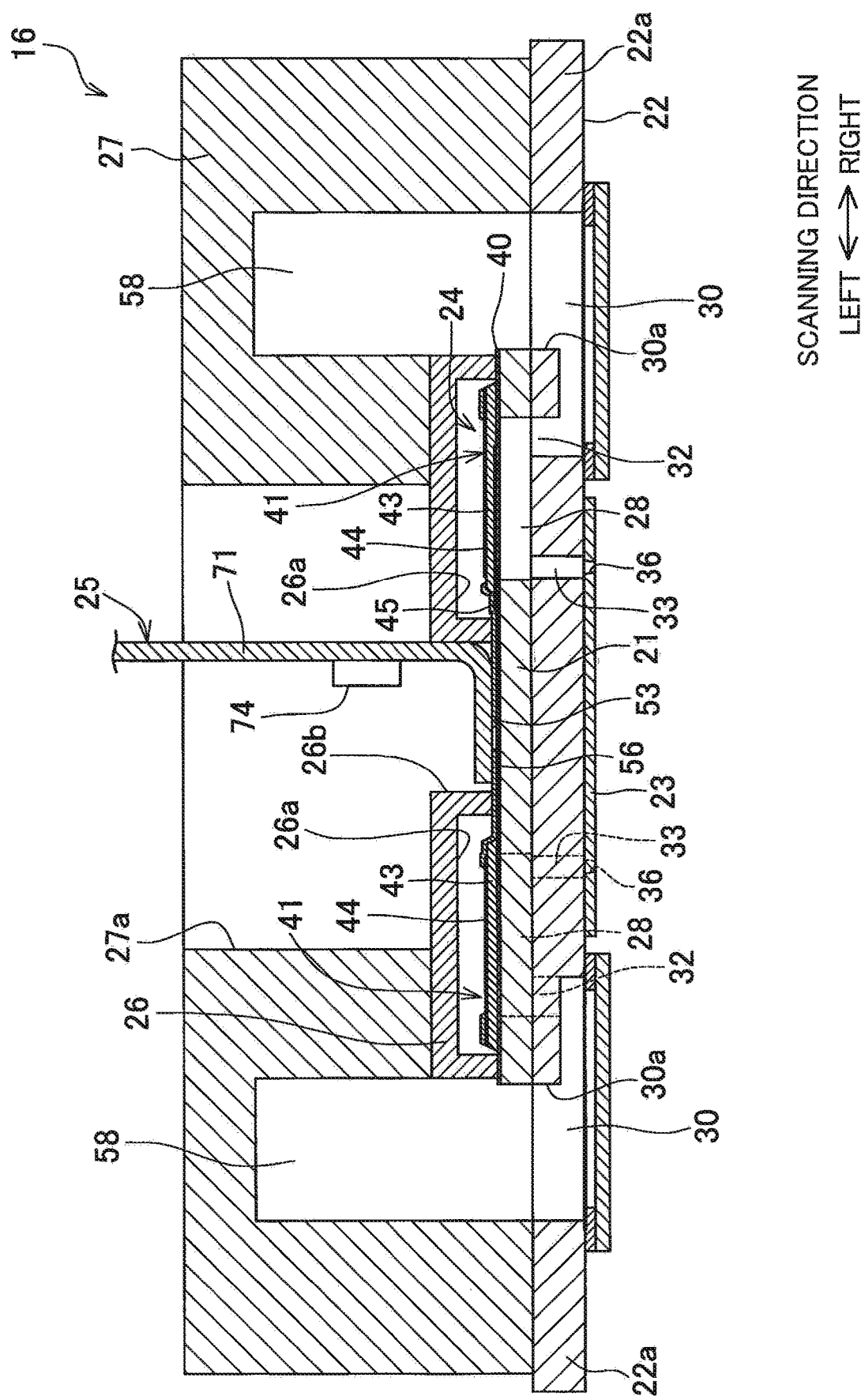
FIG. 5 is a cross-sectional view of the head unit 16 according to the embodiment taken along a line V-V in FIG. 2.

As illustrated in FIG. 5, a vibrating film 40 of the piezoelectric actuator 24 described later is formed over a top surface of the first channel member 21. The vibrating film 40 covers the pressure chambers 28. The vibrating film 40 is a silicon dioxide film formed by oxidizing a surface of the single-crystal silicon substrate constituting the first channel member 21, for example.

Figure 4:
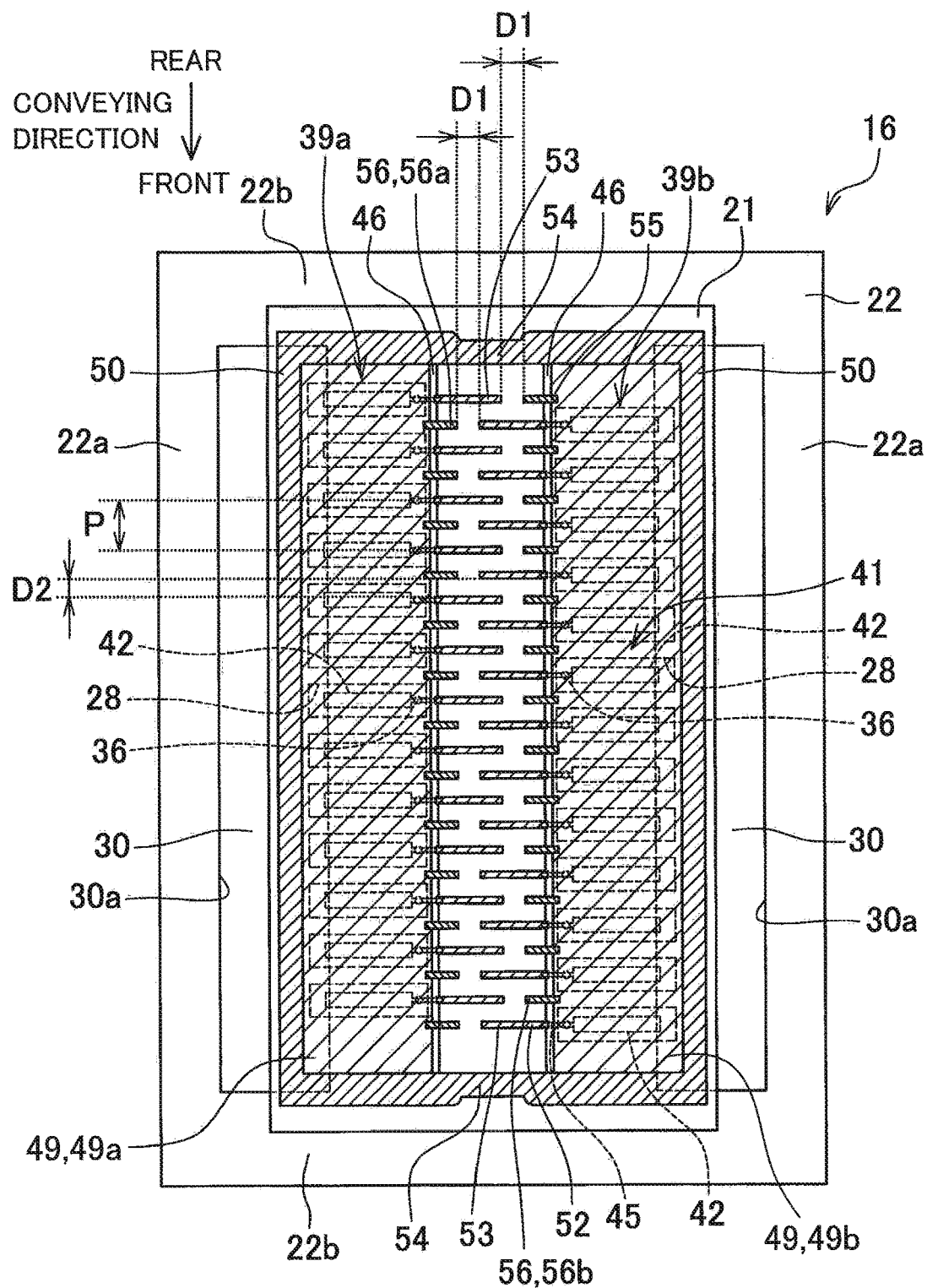
FIG. 4 is a plan view of the head unit 16 according to the embodiment, from which the ink supply member 27 and a protective member 26 are omitted.

The second channel member 22 is disposed beneath the first channel member 21. As illustrated in FIGS. 4 and 5, the second channel member 22 has a planar shape slightly larger than the first channel member 21 so that an edge portion around an entire periphery of the second channel member 22 extends beyond an outer edge of the first channel member 21. In other words, the second channel member 22 has two first extending parts 22a that extend respectively leftward and rightward from the first channel member 21, and two second extending parts 22b that extend respectively frontward and rearward from the first channel member 21.

As illustrated in FIGS. 4 and 5, two manifold channels 30 are formed in the second channel member 22, with one in the left first extending part 22a and one in the right first extending part 22a. The two manifold channels 30 extend in the conveying direction in correspondence with the two pressure chamber rows, respectively. More specifically, each manifold channel 30 has an opening 30a that is exposed to an outside of the first channel member 21. Ink is supplied from a single ink cartridge 17 to the two manifold channels 30 through the ink supply member 27 described later. In the present embodiment, ink of the same color is supplied to both of the two manifold channels 30.

Communicating channels 32 are formed in the second channel member 22 for providing fluid communication between the manifold channels 30 and the pressure chambers 28, in addition to the manifold channels 30. Each pressure chamber 28 communicates with one of the two manifold channels 30 via the corresponding communicating channel 32. In addition, communicating channels 33 are formed in the second channel member 22 for providing fluid communication between the pressure chambers 28 and the corresponding nozzles 36 formed in the nozzle plate 23 described below.

A plurality of nozzles 36 having a one-to-one correspondence with the plurality of pressure chambers 28 is formed in the nozzle plate 23. Each nozzle 36 communicates with the corresponding pressure chamber 28 via the corresponding communicating channel 33. The plurality of nozzles 36 is formed in two nozzle rows corresponding to the two pressure chamber rows. As with the pressure chamber rows described above, the nozzles 36 in the left row are offset from the nozzles 36 in the right row by P/2 in the conveying direction.

<Piezoelectric Actuator>

The piezoelectric actuator 24 is disposed above the first channel member 21. The piezoelectric actuator 24 includes a vibrating film 40, and a plurality of piezoelectric elements 41. The plurality of piezoelectric elements 41 is arranged on the vibrating film 40.

As described above, the vibrating film 40 is formed on the top surface of the first channel member 21 and covers the pressure chambers 28. The vibrating film 40 has a thickness of 1.0-1.5 µm, for example. The piezoelectric elements 41 are respectively arranged on the top surface of the vibrating film 40 at positions overlapping the pressure chambers 28. As with the pressure chambers 28, the piezoelectric elements 41 are configured of two piezoelectric element rows 39a and 39b juxtaposed with each other in the scanning direction. As with the pressure chamber rows described above, the piezoelectric elements 41 in the piezoelectric element row 39a are offset from the piezoelectric elements 41 in the piezoelectric element row 39b at a pitch of P/2 in the conveying direction. The piezoelectric element row 39a is an example of a first row and the piezoelectric element row 39b is an example of a second row.

Next, the structure of an individual piezoelectric element 41 will be described. Each piezoelectric element 41 includes a lower electrode 42 (an example of a first electrode) disposed on the vibrating film 40, a piezoelectric film 43 disposed on the lower electrode 42, and an upper electrode 44 (an example of a second electrode) disposed on the piezoelectric film 43.

The lower electrode 42 is arranged on the top surface of the vibrating film 40 at a position overlapping the corresponding pressure chamber 28. This lower electrode 42 is an individual electrode. A driver IC 74 (see FIG. 5) described later individually applies potential to each lower electrode 42. A lead 45 is led out from an inner end of each lower electrode 42 in the scanning direction. The lower electrode 42 and the lead 45 are formed of platinum (Pt), for example, and have a thickness of 0.1 µm, for example.

The piezoelectric film 43 is formed of a piezoelectric material such as lead zirconate titanate (PZT). The piezoelectric film 43 has a thickness of 1.0-2.0 µm, for example. In the present embodiment, the piezoelectric films 43 of the piezoelectric elements 41 constituting the left piezoelectric element row 39a are connected together, and the piezoelectric films 43 of the piezoelectric elements 41 constituting the right piezoelectric element row 39b are connected together. In this way, the connected piezoelectric films 43 configure two piezoelectric bodies 46 on the vibrating film 40, with one piezoelectric body 46 covering the left pressure chamber row and one piezoelectric body 46 covering the right pressure chamber row.

As illustrated in FIGS. 4 and 5, the lead 45 led out from the lower electrode 42 extends inward in the scanning direction from the lower electrode 42. A distal end portion of the lead 45 is exposed to an outside of the piezoelectric body 46 beyond an edge of the piezoelectric body 46. An individual wire 52 described later is connected to the exposed distal end portion of the lead 45.

The upper electrode 44 is disposed on a top surface of the piezoelectric film 43. The upper electrode 44 is formed of iridium, for example, and has a thickness of 0.1 µm, for example. By electrically connecting the upper electrodes 44 of the piezoelectric elements 41 together on a top surface of each piezoelectric body 46, the upper electrodes 44 configure a common electrode 49 that covers substantially the entire top surface of the corresponding piezoelectric body 46. That is, the upper electrodes 44 of the piezoelectric elements 41 in the piezoelectric element row 39a constitute one common electrode 49a while the upper electrodes 44 of the piezoelectric elements 41 in the piezoelectric element row 39b constitute one common electrode 49b. Thus, the left common electrode 49a covers the left piezoelectric body 46 and the right common electrode 49b covers the right piezoelectric body 46. The common electrode 49a is an example of a first common electrode. The common electrode 49b is an example of a second common electrode.

An auxiliary conductor 50 is provided on the common electrodes 49. As illustrated in FIG. 4, the auxiliary conductor 50 is mounted over the common electrodes 49 along outer left-right edges, a front edge, and a rear edge of the piezoelectric bodies 46. The auxiliary conductor 50 is formed of gold (Au), for example, and has a thickness greater than the thickness of the common electrodes 49. The auxiliary conductor 50 has portions that are positioned on both ends in the front-rear direction and between the piezoelectric element rows 39a and 39b. These portions of the auxiliary conductor 50 constitute common contacts 54 used to establish connections with the COF 25.

Further, individual wires 52 (an example of first individual wires) are connected to the distal end portions of the corresponding leads 45 exposed from the piezoelectric bodies 46. Each individual wire 52 extends inward in the scanning direction from the distal end portion of the corresponding lead 45. The individual wires 52 are formed of gold (Au), for example. The individual wires 52 may be formed together with the auxiliary conductor 50 in the same deposition process. The individual wires 52 also extend on the top surface of the vibrating film 40 to an area between the piezoelectric element rows 39a and 39b. The individual wires 52 led out from the piezoelectric element row 39a is an example of a first group of the first individual wires, while the individual wires 52 led out from the piezoelectric element row 39b is an example of a second group of the first individual wires.

A distal end portion of each individual wire 52 constitutes an individual contact 53 (an example of a first individual contact) for establishing a connection with the COF 25. The individual contacts 53 led out from the piezoelectric element row 39a are arranged so as to alternate in the conveying direction with the individual contacts 53 led out from the piezoelectric element row 39b.

Further, a plurality of common wires 55 (an example of first common wires) is connected to an inner left-right edge of each common electrode 49. The common wires 55 are formed of gold (Au), for example. The common wires 55 may be formed together with the auxiliary conductor 50 in the same deposition process. The common wires 55 extend inward in the scanning direction from their connection portions with the corresponding common electrodes 49 to the area between the piezoelectric element rows 39a and 39b on the vibrating film 40. A distal end portion of each common wire 55 constitutes a common contact 56 (an example of a first common contact and an example of a first common contact part) for establishing a connection with the COF 25.

With this arrangement, the common contacts 56 led out from the piezoelectric element row 39a (hereinafter also referred to as "common contacts 56a") are respectively positioned on extension lines of the individual contacts 53 extending in longitudinal directions of the corresponding individual wires 52 that are led out from the piezoelectric element row 39b, and are arrayed in the conveying direction at positions leftward of these individual contacts 53. Similarly, the common contacts 56 led out from the piezoelectric element row 39b (hereinafter also referred to as "common contacts 56b") are respectively positioned on extension lines of the individual contacts 53 extending in the longitudinal directions of the corresponding individual wires 52 that are led out from the piezoelectric element row 39a, and are arrayed in the conveying direction at positions rightward of these individual contacts 53.

The common wires 55 connected to the common electrode 49a constitutes a first common wire group, while the common wires 55 connected to the common electrode 49b constitutes a second common wire group. The common contacts 56a led out from the piezoelectric element row 39a constitutes a first contact group, while the common contacts 56b led out from the piezoelectric element row 39b constitutes a second contact group.

As illustrated in FIG. 4, a spacing D1 (an example of a separation distance) between each common contact 56 and the corresponding individual contact 53 in the longitudinal direction of the individual wire 52 is greater than a clearance D2 (an example of an interval) in the conveying direction between neighboring individual contacts 53 led out from the piezoelectric element rows 39a and 39b. For example, the clearance D2 is approximately 40 μm, while the spacing D1 is approximately 100 μm.

<Protective Member>

Figure 2:
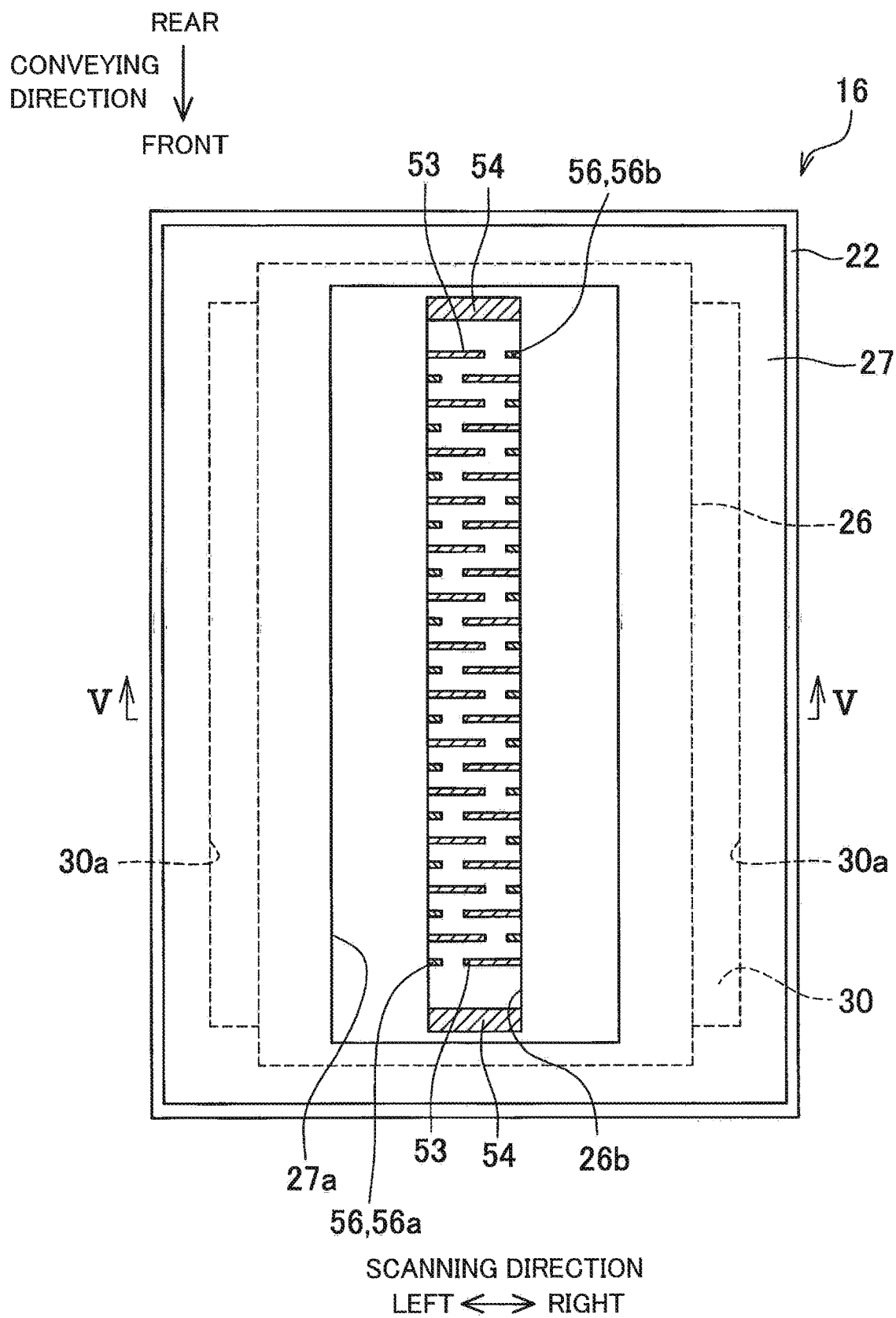
FIG. 2 is a plan view of a head unit 16 provided in the printer 1 according to the embodiment.
Figure 3:
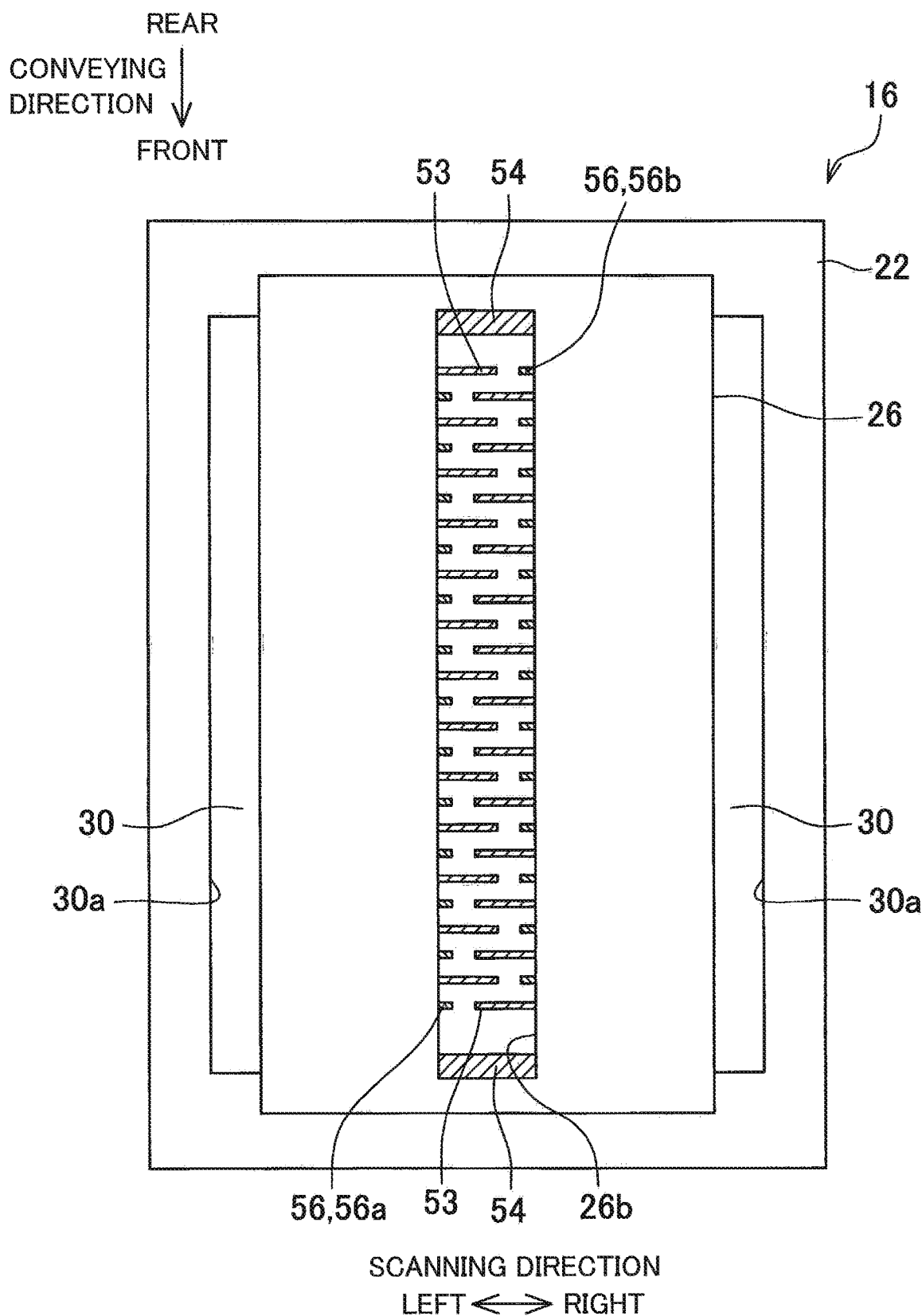
FIG. 3 is a plan view of the head unit 16 according to the embodiment, from which an ink supply member 27 is omitted.

As illustrated in FIGS. 2, 3, and 5, the protective member 26 is disposed above the first channel member 21 for covering the plurality of piezoelectric elements 41. Specifically, the protective member 26 is adhesively bonded to the piezoelectric actuator 24 that has a multilayered structure including the vibrating film 40, the piezoelectric films 43, and other films.

The protective member 26 has two left and right concave cover parts 26a, and an opening 26b formed between the two concave cover parts 26a. With the protective member 26 disposed on the first channel member 21, the left cover part 26a covers the left piezoelectric element row 39a, and the right cover part 26a covers the right piezoelectric element row 39b. The plurality of individual contacts 53, the two common contacts 54, and the plurality of common contacts 56 are exposed to an outside through the opening 26b, as illustrated in FIG. 3. While there is no particular restriction on the material used to form the protective member 26, the protective member 26 is preferably formed of silicon, for example.

<COF>

Figure 6:
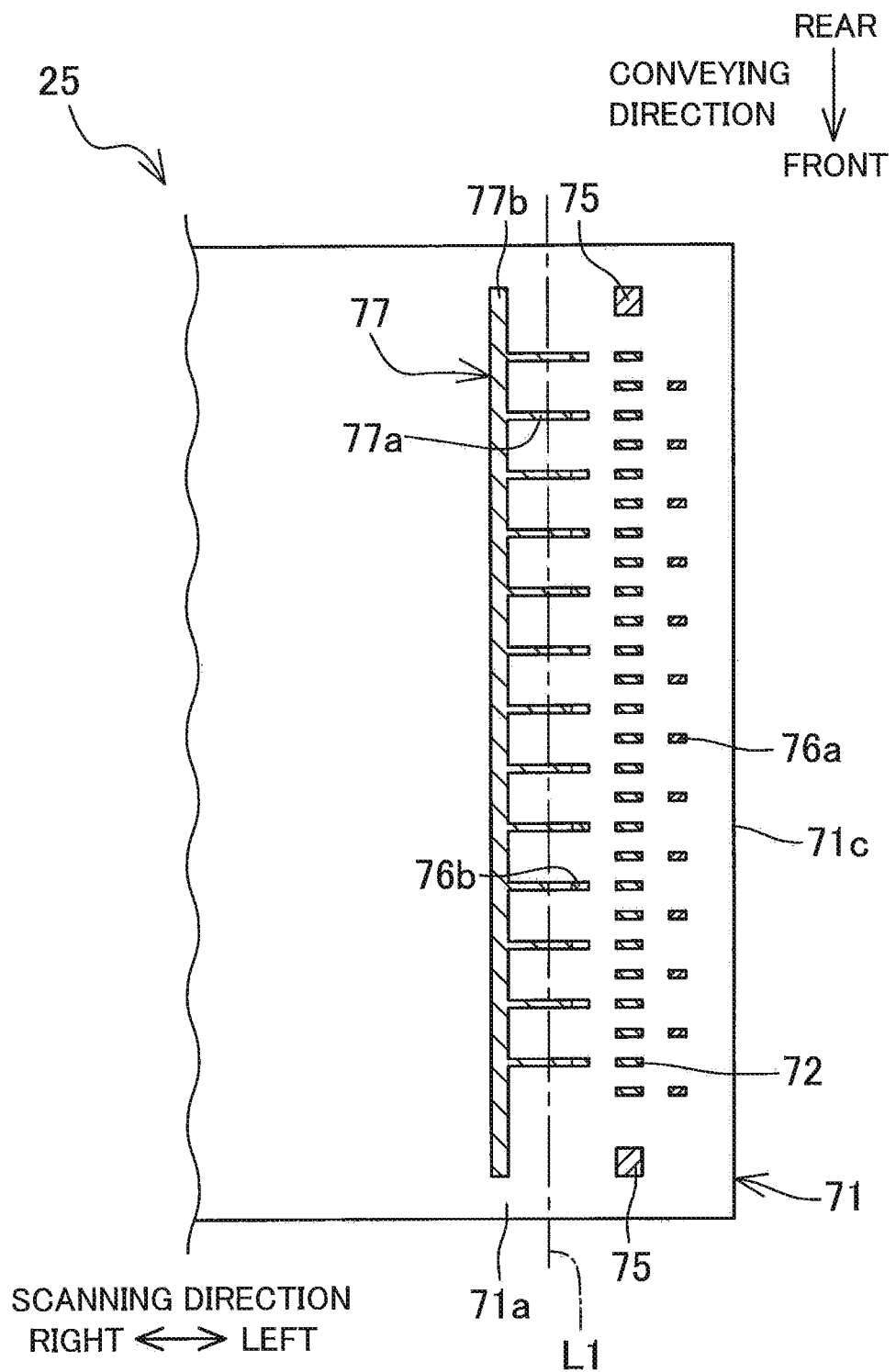
FIG. 6 is a plan view of a bottom surface 71a of a base 71 of a COF 25 provided in the head unit 16 according to the embodiment.
Figure 7:
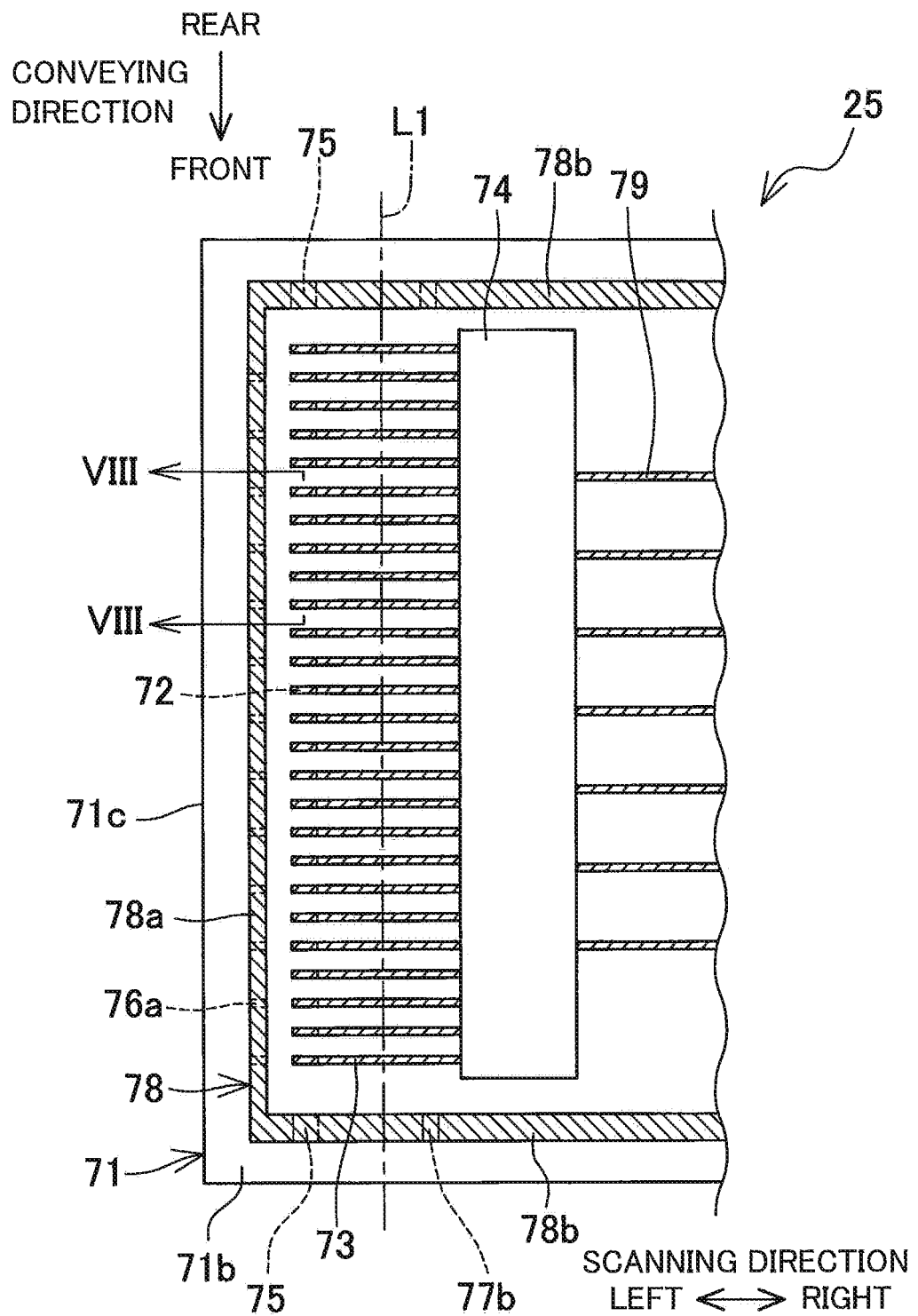
FIG. 7 is a plan view of a top surface 71b of the base 71 of the COF 25 according to the embodiment.

As illustrated in FIGS. 6 and 7, the COF 25 (an example of a wiring member) includes a base 71, a plurality of individual contacts 72 (an example of second individual contacts), a plurality of individual wires 73 (an example of second individual wires), the driver IC 74, two common contacts 75, pluralities of common contacts 76a and 76b (an example of second common contacts), and common wires 77 and 78 (an example of second common wires).

The base 71 is a film-like member formed of a synthetic resin material, such as polyimide, or the like. The base 71 is bonded to a top surface of the piezoelectric actuator 24 in the area between the piezoelectric element rows 39a and 39b that is exposed through the opening 26b formed in the protective member 26. The base 71 has an edge 71c positioned on a left side relative to an area in which the base 71 is bonded to the piezoelectric actuator 24. The base 71 extends rightward from the area bonded to the piezoelectric actuator 24 and then bends at a midpoint of the base 71 in the left-right direction and extends upward therefrom. Note that, although the base 71 bends at the midpoint in the left-right direction and extends upward in the present embodiment, in the following description a surface of the base 71 a part of which is bonded to the piezoelectric actuator 24 (i.e. a surface of the base 71 on the piezoelectric actuator 24 side) will be referred to as a bottom surface 71a of the base 71 while a surface of the base 71 on an opposite side of the bottom surface 71a (i.e. a surface of the base 71 on an opposite side of the piezoelectric actuator 24) will be referred to as a top surface 71b of the base 71 for convenience.

The individual contacts 72 are arranged on the bottom surface 71a of the base 71 in regions opposing the individual contacts 53 and are connected to the corresponding individual contacts 53. With this arrangement, the individual contacts 72 connected to the individual contacts 53 that are led out from the piezoelectric element row 39a alternate in the conveying direction with the individual contacts 72 connected to the individual contacts 53 that are led out from the piezoelectric element row 39b. The individual contacts 72 connected to the individual contacts 53 led out from the piezoelectric element row 39a constitutes a first individual contact group, while the individual contacts 72 connected to the individual contacts 53 led out from the piezoelectric element row 39b constitutes a second individual contact group. Further, the individual contacts 72 are led onto the top surface 71b of the base 71 via through-holes 81 (see FIG. 8) formed in the base 71.

The individual wires 73 are arranged on the top surface 71b of the base 71. The individual wires 73 are provided in correspondence with the individual contacts 72, respectively. The individual wires 73 are respectively connected to the individual contacts 72 led onto the top surface 71b of the base 71 and extend linearly rightward from their connection portions with the individual contacts 72. The driver IC 74 is mounted on the top surface 71b of the base 71 at a portion of the base 71 that extends upward. The individual wires 73 have one end portions, and the other end portions opposite the one end portions and connected to the individual contacts 72. The one end portions of the individual wires 73 are connected to the driver IC 74. The driver IC 74 selectively applies a potential to each lower electrode 42 individually via the corresponding individual wires 73, the corresponding individual contacts 72, and the corresponding individual wires 52. The potential selectively applied by the driver IC 74 is one of a ground potential and a drive potential of approximately 20V. The driver IC 74 is also connected to a controller (not illustrated) via wires 79 and the like arranged on the top surface 71b of the base 71. The controller controls the operations of the driver IC 74.

The two common contacts 75 are arranged on the bottom surface 71a of the base 71 in regions opposing the two common contacts 54 and are connected to the corresponding common contacts 54. The common contacts 75 are also led onto the top surface 71b of the base 71 via through-holes (not illustrated) formed in the base 71.

The common contacts 76a are arranged on the bottom surface 71a of the base 71 in regions opposing the common contacts 56a and are connected to the corresponding common contacts 56a. With this arrangement, the common contacts 76a are arrayed in the conveying direction at positions leftward of the individual contacts 72. The common contacts 76a are also led onto the top surface 71b of the base 71 via through-holes (not illustrated) formed in the base 71. The common contacts 76a constitute a first common contact group.

The common contacts 76b are arranged on the bottom surface 71a of the base 71 in regions opposing the common contacts 56b and are connected to the corresponding common contacts 56b. With this arrangement, the common contacts 76b are arrayed in the conveying direction at positions rightward of the individual contacts 72. The common contacts 76b constitute a second common contact group.

The common wire 77 is arranged on the bottom surface 71a of the base 71. The common wire 77 has a plurality of branch parts 77a, and a single base part 77b. The branch parts 77a are individually provided for each of the common contacts 76b. The branch parts 77a are connected to the corresponding common contacts 76b and extend rightward in the scanning direction from their connection portions with the common contacts 76b. The base 71 is bent upward at a fold line L1 illustrated in FIG. 6, and the branch parts 77a extend to positions opposite the common contacts 76b with respect to the fold line L1. The base part 77b extends in the conveying direction and is connected to right ends of all the branch parts 77a in the scanning direction. Both end portions of the base part 77b in the conveying direction are led onto the top surface 71b of the base 71 via through-holes (not illustrated) formed in the base 71.

The common wire 78 is arranged on the top surface 71b of the base 71. The common wire 78 has a portion 78a that extends in the conveying direction and is connected to the plurality of common contacts 76a led onto the top surface 71b of the base 71, and two portions 78b that respectively extend rightward in the scanning direction from both ends of the portion 78a in the conveying direction. The two portions 78b are also connected to the two corresponding common contacts 75 and corresponding ends of the base part 77b of the common wire 77 in the conveying direction that are led onto the top surface 71b of the base 71. The common wire 78 is connected to a power supply (not illustrated) and is maintained at a ground potential. Consequently, the common electrodes 49 (upper electrodes 44) are maintained at a ground potential through the common wires 77 and 78, the common contacts 75, 76a, and 76b, the common wires 55, and the auxiliary conductor 50.

Figure 8:
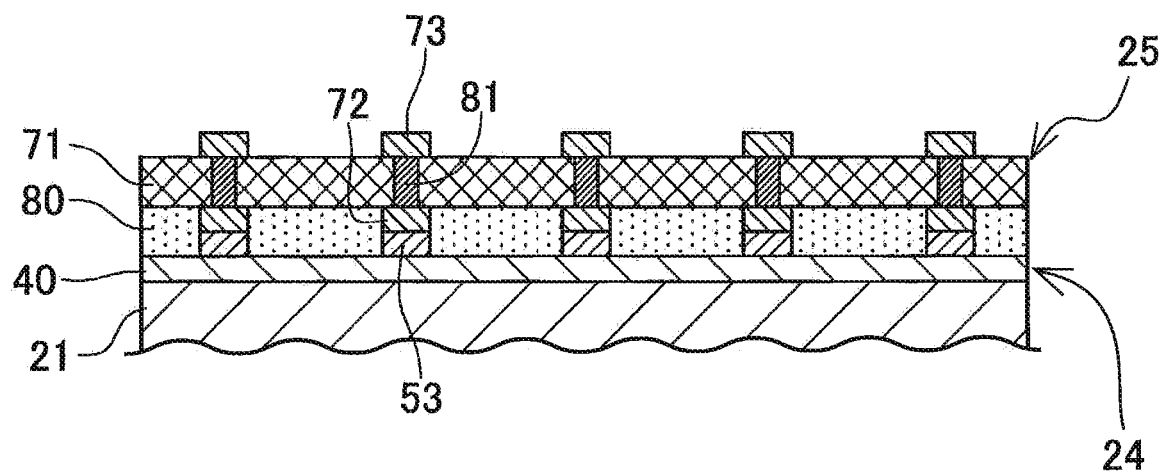
FIG. 8 is a cross-sectional view of the base 71 of the COF 25 according to the embodiment taken along a line VIII-VIII in FIG. 7.

As illustrated in FIG. 8, the piezoelectric actuator 24 and the COF 25 are bonded together with non-conductive film (NCF) 80 (an example of a non-conductive adhesive) in the present embodiment. The individual contacts 53 of the piezoelectric actuator 24 are in direct contact with the individual contacts 72 of the COF 25, so that the individual contacts 53 of the piezoelectric actuator 24 and the individual contacts 72 of the COF 25 are electrically connected to each other. Similarly, while not illustrated in the drawings, the common contacts 54 of the piezoelectric actuator 24 are in direct contact with the common contacts 75 of the COF 25, so that the common contacts 54 of the piezoelectric actuator 24 and the common contacts 75 of the COF 25 are electrically connected to each other. Further, the common contacts 56a, 56b of the piezoelectric actuator 24 are respectively in direct contact with the common contacts 76a, 76b of the COF 25, so that the common contacts 56a, 56b of the piezoelectric actuator 24 and the common contacts 76a, 76b of the COF 25 are electrically connected to each other.

Thus, in the present embodiment, the piezoelectric actuator 24 and the COF 25 are bonded together according to NCF bonding.

<Operations of Piezoelectric Elements>

Next, operations of the piezoelectric elements 41 will be described. Each piezoelectric element 41 maintains the lower electrode 42 at the same ground potential as the upper electrode 44. When the piezoelectric element 41 is driven, the potential of the lower electrode 42 is switched from the ground potential to the drive potential. As a result, the difference in potential between the lower electrode 42 and the upper electrode 44 applies an electric field to the piezoelectric film 43 in the thickness direction of the piezoelectric film 43. This electric field causes the piezoelectric film 43 to expand in its thickness direction and contract in its planar direction, thereby forcing the vibrating film 40 that covers the pressure chamber 28 to warp into a convex shape toward the pressure chamber 28. Consequently, the capacity in the pressure chamber 28 is decreased, increasing the pressure on ink in the pressure chamber 28 and causing an ink droplet to be ejected from the nozzle 36 that communicates with the pressure chamber 28.

<Ink Supply Member>

As illustrated in FIGS. 2 and 5, the ink supply member 27 has a rectangular planar shape that is substantially the same size as the second channel member 22. The ink supply member 27 is disposed above the second channel member 22 and the protective member 26. The ink supply member 27 is formed of synthetic resin, for example, but is not particularly limited to any material. As illustrated in FIGS. 2 and 5, an opening 27a is formed in a center region of the ink supply member 27 in the scanning direction. The opening 27a overlaps the opening 26b formed in the protective member 26 and has a width greater than that of the opening 26b. As illustrated in FIG. 5, the COF 25 connected to the piezoelectric actuator 24 extends upward through the opening 26b of the protective member 26 and the opening 27a of the ink supply member 27.

The ink supply member 27 is connected to the cartridge holder 7 in which the ink cartridges 17 are mountable (see FIG. 1). Ink supply channels 58 (see FIG. 5) are formed inside the ink supply member 27. The bottom ends of the ink supply channels 58 are in fluid communication with the manifold channels 30 formed in the first extending parts 22a of the second channel member 22. With this configuration, ink in the ink cartridges 17 mounted in the cartridge holder 7 is supplied to the manifold channels 30 of the second channel member 22 through the ink supply channels 58 of the ink supply member 27.

Here, a configuration different from the embodiment described above will be considered. In this configuration, the common wires 55 are eliminated, and the common electrodes 49 are connected to the common wire 78 of the COF 25 via the common contacts 54 only. In this case, the internal resistance of each common electrode 49 would produce variation in potential between ends of the common electrode 49 closer to the common contacts 54 in the conveying direction and a center region of the common electrode 49 farther from the common contacts 54 in the conveying direction. Such variation in potential among different areas of the common electrodes 49 would produce different drive characteristics among the piezoelectric elements 41 and could result in different ink ejection characteristics among the nozzles 36.

However, in the present embodiment, the common wires 55 are led out from the common electrodes 49 for both the piezoelectric element rows 39a and 39b at a plurality of locations in the conveying direction thereof. Thus, the common electrodes 49 are connected to the common wires 77 and 78 of the COF 25 through the common contacts 56 provided at the distal end portions of the common wires 55 in addition to being connected to the common wire 78 through the common contacts 54 positioned on both end portions of the auxiliary conductor 50 in the conveying direction. This arrangement can suppress variation in potential among different areas of the common electrodes 49.

In the present embodiment, the common wires 55 (common contacts 56b) led out from the right piezoelectric element row 39b are arranged in regions on the top surface of the vibrating film 40 positioned on the extensions lines of the individual wires 52 led out from the left piezoelectric element row 39a. Similarly, the common wires 55 (common contacts 56a) led out from the left piezoelectric element row 39a are arranged in regions on the top surface of the vibrating film 40 positioned on the extension lines of the individual wires 52 led out from the right piezoelectric element row 39b. Thus, without increasing the gaps between the individual wires 52 to arrange the common wires 55, the common wires 55 can be disposed at positions close to the individual wires 52.

In the present embodiment, the plurality of individual contacts 53, the two common contacts 54, and the plurality of common contacts 56 led out from the piezoelectric element rows 39a and 39b are arranged in the area between the piezoelectric element rows 39a and 39b. In this way, the configuration of the present embodiment can reduce the bonding surface area between the piezoelectric actuator 24 and the COF 25 by concentrating the contacts for forming connections with the COF 25 in one location.

Further, in the present embodiment, the positions of the individual wires 52 in the conveying direction are offset between the piezoelectric element rows 39a and 39b. That is, the individual wires 52 led out from the piezoelectric element row 39a are offset in the conveying direction from the individual wires 52 led out from the piezoelectric element row 39b. In other words, the individual wires 52 led out from the piezoelectric element row 39a and the individual wires 52 led out from the piezoelectric element row 39b are arranged so as to be alternated with each other in the conveying direction. Thus, regions positioned on the extension lines of the individual wires 52 led out from the piezoelectric element row 39a form space between neighboring pairs of individual wires 52 led out from the piezoelectric element row 39b. Similarly, regions positioned on the extension lines of the individual wires 52 led out from the piezoelectric element row 39b form space between neighboring pairs of individual wires 52 led out from the piezoelectric element row 39a. In the present embodiment, these spaces made available on the top surface of the vibrating film 40 are used for arranging the common wires 55.

Here, an individual wire 52 and a neighboring common wire 55 (common contact 56) could short-circuit if the distance between the individual wire 52 and the common wire 55 were too small. Therefore, in the present embodiment, the spacing D1 between the individual contact 53 and the common contact 56 in the longitudinal direction of the individual wire 52 is set greater than the clearance D2 between the individual contacts 53 in the conveying direction. This arrangement can prevent the risk of short-circuiting between the individual wires 52 and the common wires 55.

Further, the plurality of individual contacts 53 and the plurality of common contacts 56 that are led out from the piezoelectric element rows 39a and 39b are arranged on the top surface of the vibrating film 40 in an area inwardly remote from the piezoelectric films 43 in the scanning direction. With this arrangement, the plurality of individual contacts 53 and the plurality of common contacts 56 are arranged on the same plane, making it easier to bond the COF 25 to the piezoelectric actuator 24.

In addition, the contacts 53, 54, and 56 are arranged on the top surface of the vibrating film 40 in the area exposed to the outside through the opening 26b formed in the protective member 26 and the opening 27a formed in the ink supply member 27, i.e., the area on the surface of the vibrating film 40 not overlapped by the protective member 26 and the ink supply member 27. This arrangement enables the COF 25 to be connected to the contacts 53, 54, and 56.

Further, the common contacts 76b are arranged on the bottom surface 71a of the base 71 that is bonded to the piezoelectric actuator 24. The common contacts 76b are positioned rightward of the individual contacts 72. If individual wires were arranged on the bottom surface 71a of the base 71, unlike in the present embodiment, the individual wires would need to be routed so as to skirt around the corresponding common contacts 76b, as illustrated in a first modification described later (see FIG. 9), for example. However, in the present embodiment, the individual wires 73 are arranged on the top surface 71b of the base 71 on which the common contacts 76a and 76b are not arranged. Hence, this configuration enhances degree of freedom for routing the individual wires 73.

Further, in the present embodiment, the individual wires 52 are arrayed in the conveying direction (an example of a first direction) on the piezoelectric actuator 24, and the individual contacts 72 are arrayed in the conveying direction (an example of a third direction) on the COF 25. In other words, the third direction is parallel to the first direction. Further, in the piezoelectric actuator 24, the individual wires 52 are led out from the piezoelectric elements 41 in the scanning direction (an example of a second direction), and the base 71 of the COF 25 extends in the scanning direction (an example of a fourth direction) from its area of connection with the piezoelectric actuator 24. Thus, the fourth direction is parallel to the second direction. Accordingly, the actuator device configured by the piezoelectric actuator 24 and the COF 25 can be achieved through a simple construction.

In the present embodiment, multiple contacts including the plurality of individual contacts 53, the two common contacts 54, and the plurality of common contacts 56 are densely arranged on the piezoelectric actuator 24. In correspondence with these contacts, multiple contacts including the plurality of individual contacts 72, the two common contacts 75, and the pluralities of common contacts 76a and 76b are densely arranged on the bottom surface 71a of the base 71 in the COF 25. For this reason, in the present embodiment, the piezoelectric actuator 24 and the COF 25 are bonded together using the NCF 80 in a process known as NCF bonding. Accordingly, when multiple contacts are arranged densely as described above, the NCF 80 can prevent short-circuiting between the contacts.

<Modifications>

While the description has been made in detail with reference to the embodiment thereof, it would be apparent to those skilled in the art that many modifications and variations may be made therein without departing from the scope of the disclosure.

<First Modification>

A first modification of the embodiment will be described with reference to FIGS. 9 and 10, wherein like parts and components are designated by the same reference numerals as those of the above-described embodiment to avoid duplicating description.

In the above-described embodiment, the individual contacts 72 are led onto the top surface 71b of the base 71, and the individual wires 73 and the driver IC 74 are arranged on the top surface 71b of the base 71.

Figure 9:
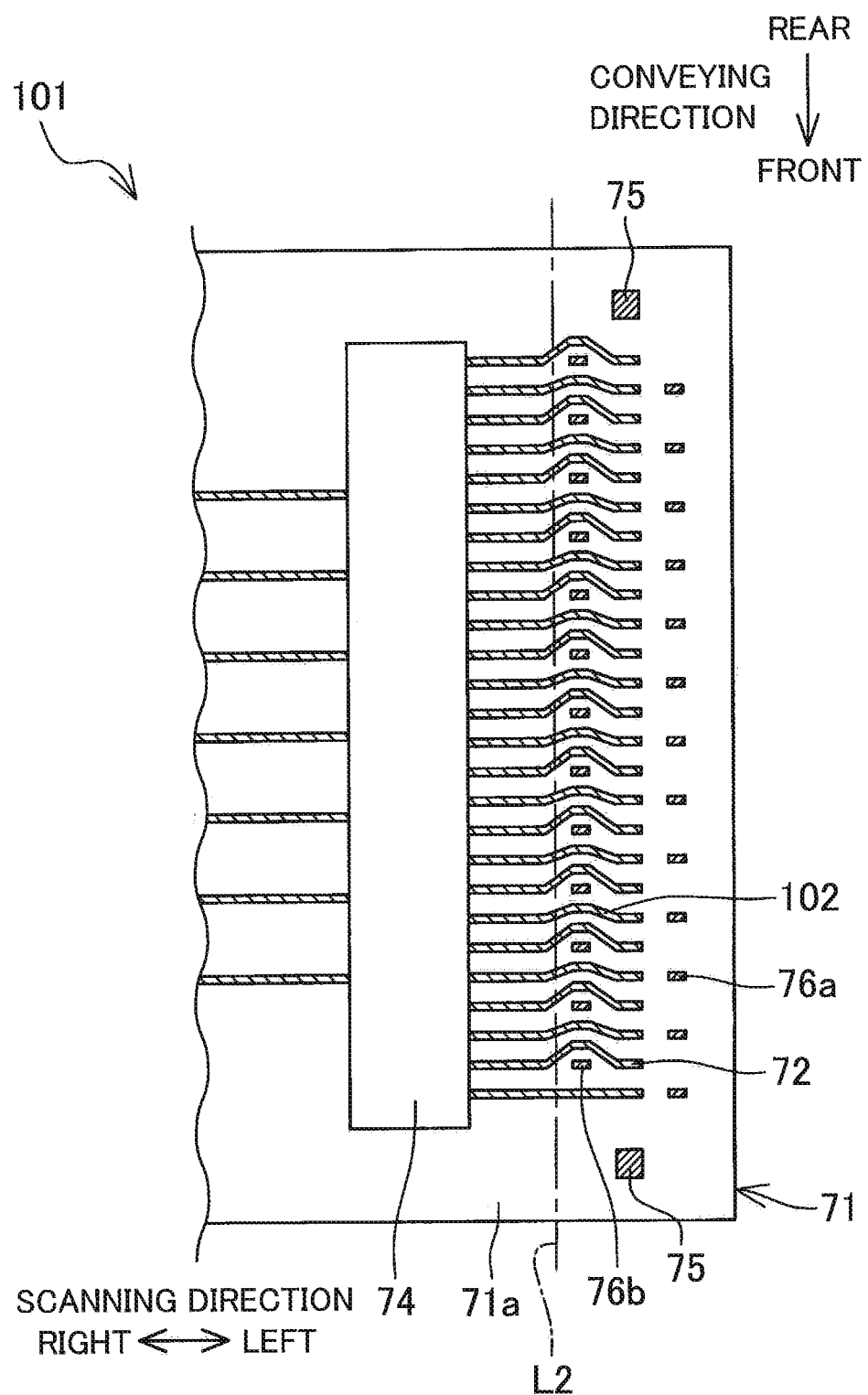
FIG. 9 is a plan view of the bottom surface 71a of the base 71 of a COF 101 according to a first modification.
Figure 10:
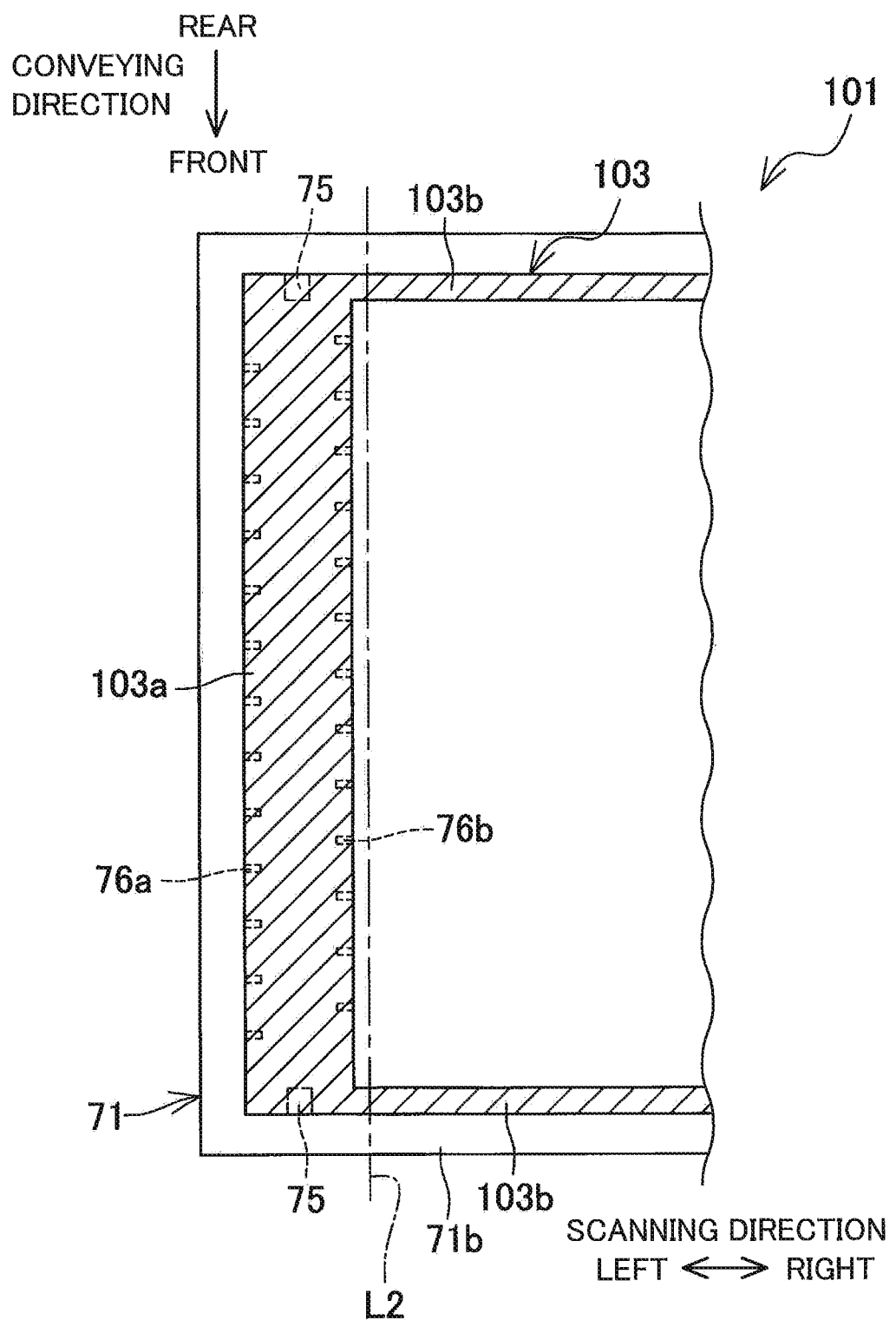
FIG. 10 is a plan view of the top surface 71b of the base 71 of the COF 101 according to the first modification.

However, in a COF 101 according to the first modification, the driver IC 74 is mounted on the bottom surface 71a of the base 71 as illustrated in FIG. 9. Further, the plurality of individual contacts 72 is not led onto the top surface 71b of the base 71 but rather is connected to a plurality of corresponding individual wires 102 arranged on the bottom surface 71a of the base 71 as illustrated in FIGS. 9 and 10. The individual wires 102 are routed so as to skirt around the corresponding common contacts 76b and are connected to the driver IC 74. The individual wires 102 connected to the individual contacts 72 that are connected to the individual contact 53 led out from the piezoelectric element row 39a constitutes a first individual wire group, while the individual wires 102 connected to the individual contacts 72 that are connected to the individual contact 53 led out from the piezoelectric element row 39b constitutes a second individual wire group.

In the first modification, the two common contacts 75 and the pluralities of common contacts 76a and 76b are led from the bottom surface 71a onto the top surface 71b, and are connected to a common wire 103 arranged on the top surface 71b of the base 71. The common wire 103 has a portion 103a that expands in the scanning direction and the conveying direction over the common contacts 75, 76a, and 76b, and two portions 103b that respectively extend rightward in the scanning direction from both ends of the portion 103a in the conveying direction. Further, in the first modification, as illustrated in FIG. 9, the base 71 bends upward at a fold line L2 positioned immediately rightward of the common contacts 76b.

<Second Modification>

Figure 12:
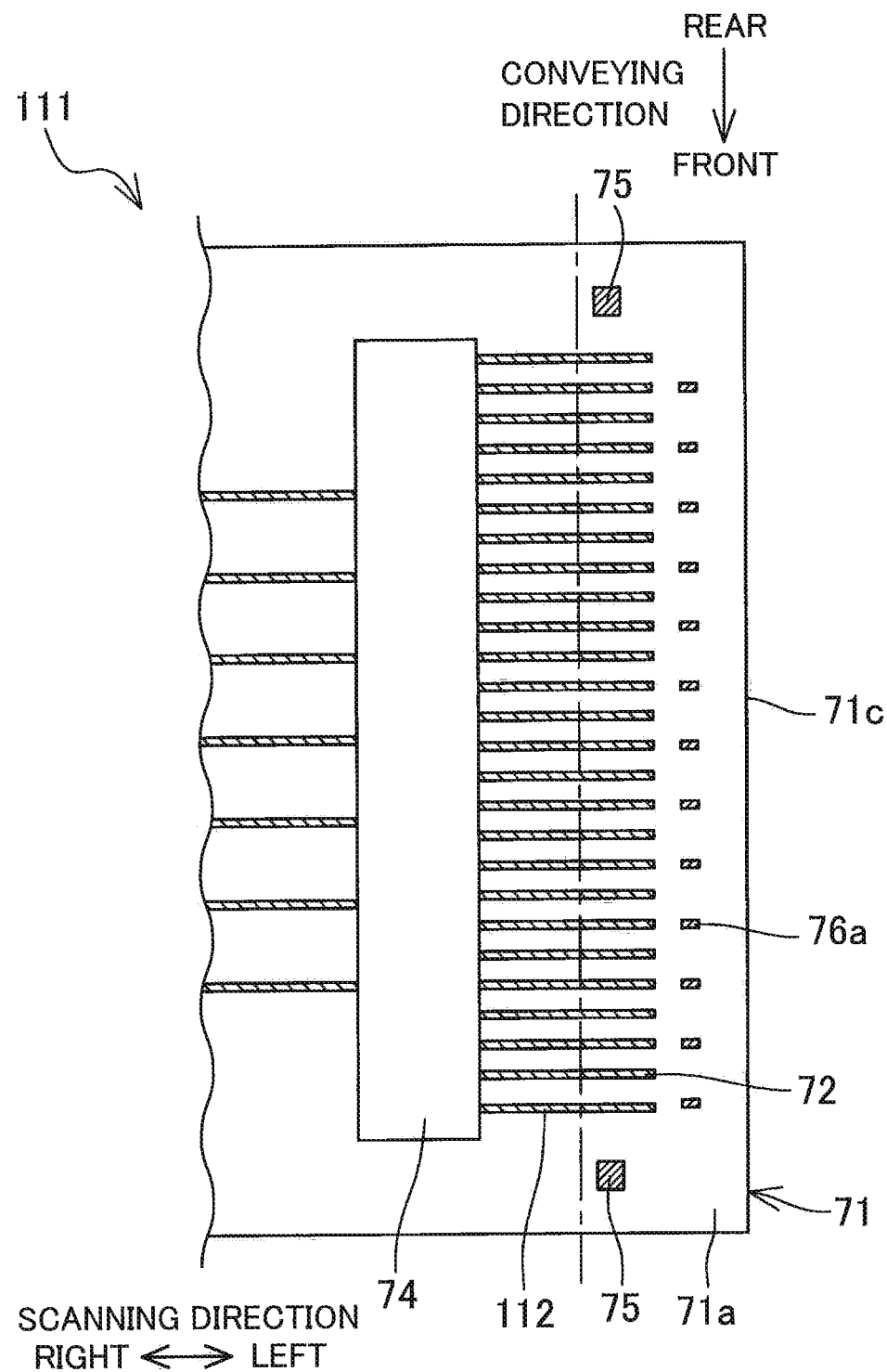
FIG. 12 is a plan view of the bottom surface 71a of the base 71 of a COF 111 according to the second modification.
Figure 13:
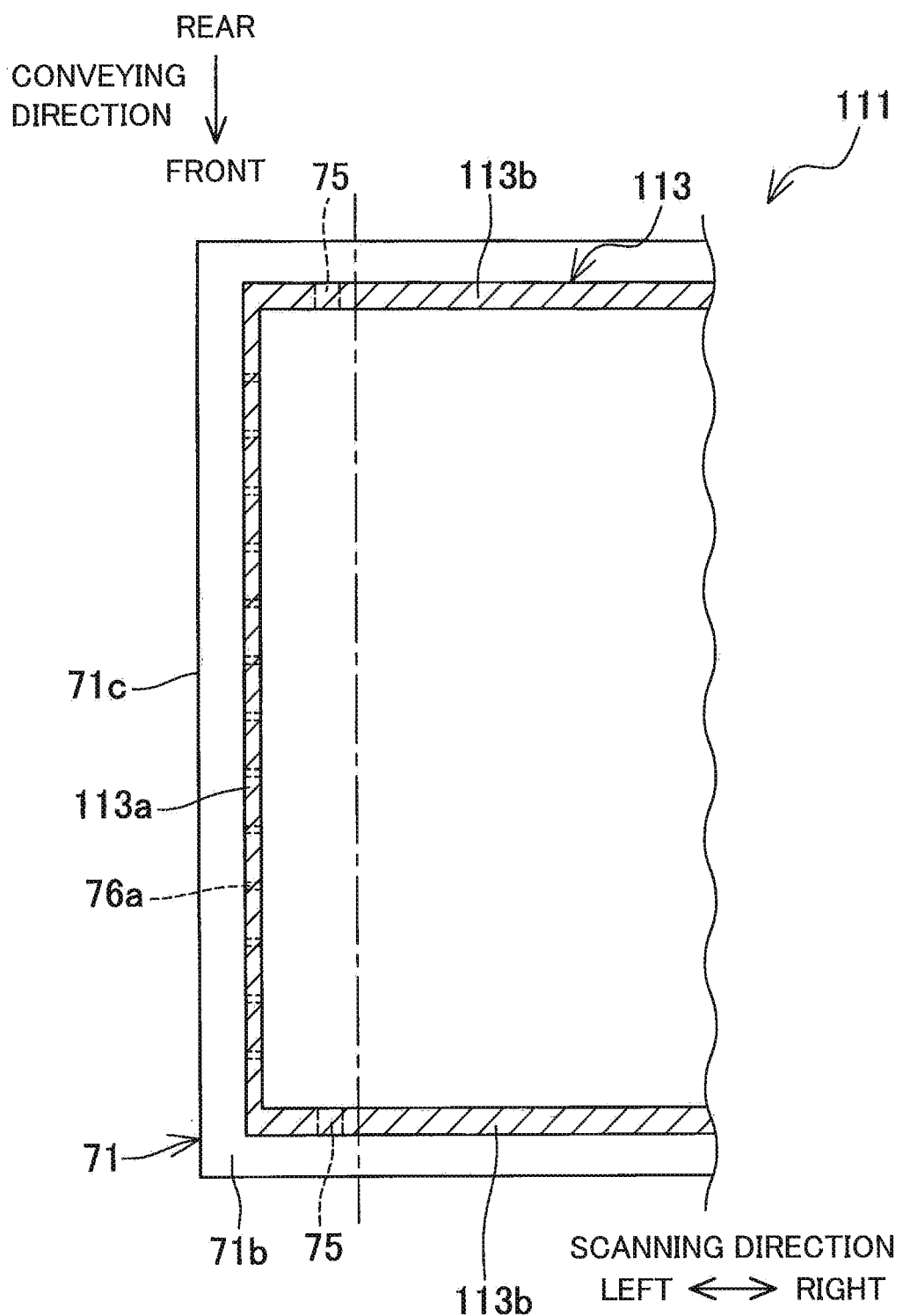
FIG. 13 is a plan view of the top surface 71b of the base 71 of the COF 111 according to the second modification.

A second modification of the embodiment will be described with reference to FIGS. 11 through 13, wherein like parts and components are designated by the same reference numerals as those of the above-described embodiment and modification to avoid duplicating description.

In the embodiment and the first modification described above, the common contacts 56a and 56b are respectively led out from the piezoelectric element rows 39a and 39b.

Figure 11:
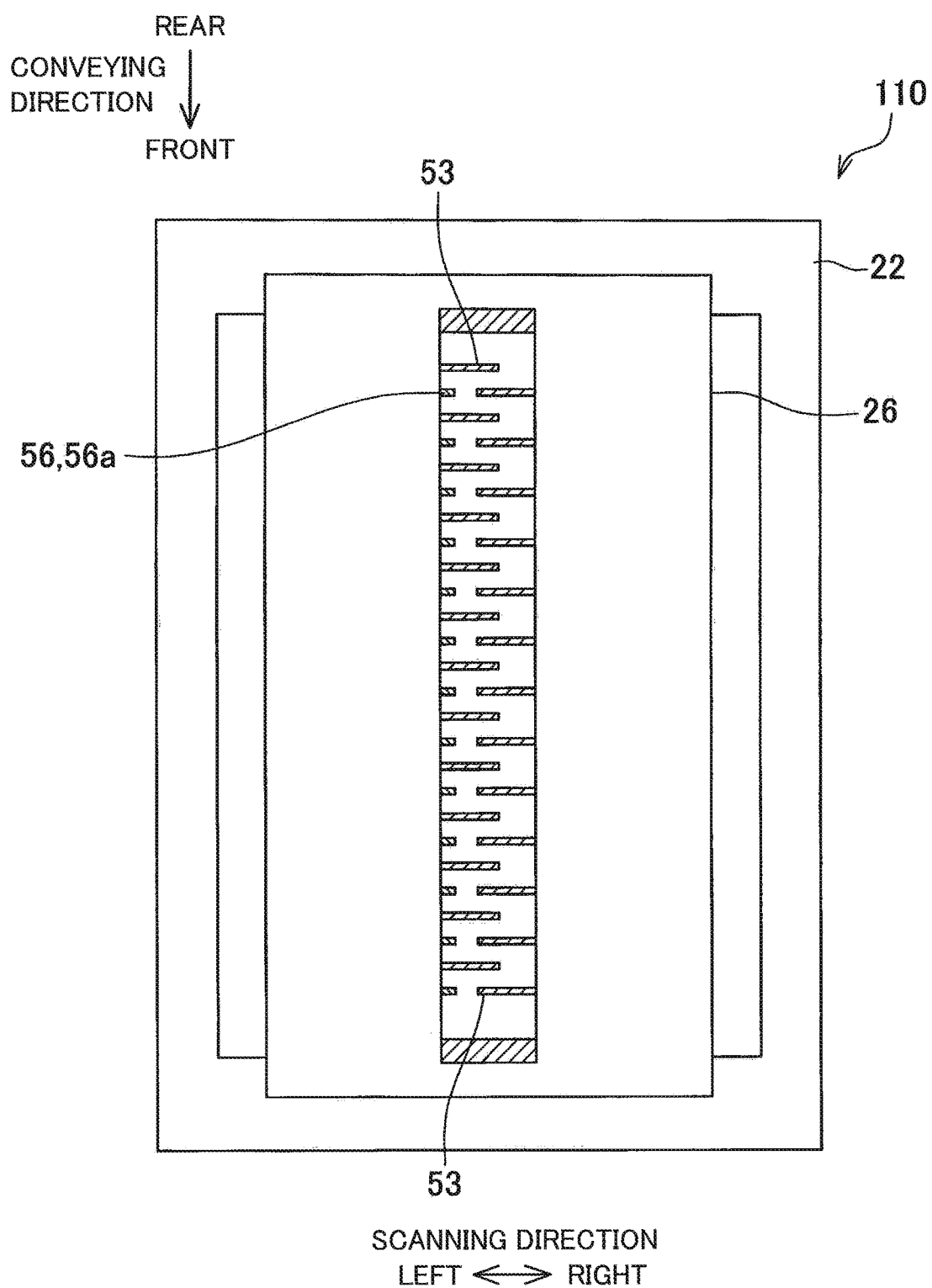
FIG. 11 is a plan view of a head unit 110 according to a second modification, from which the ink supply member 27 is omitted.

However, in a head unit 110 according to the second modification, the common contacts 56 are led out only from the left piezoelectric element row 39a as illustrated in FIG. 11. In other words, in the second modification, the common contacts 56a led out from the left piezoelectric element row 39a are provided in the head unit 110, but the common contacts 56b led out from the right piezoelectric element row 39b (see FIG. 3) are not provided in the head unit 110. In a COF 111 of the head unit 110 illustrated in FIGS. 12 and 13, a plurality of individual wires 112 connected to the plurality of corresponding individual contacts 72 is arranged on the bottom surface 71a of the base 71. The two common contacts 75 and the plurality of common contacts 76a are led onto the top surface 71b of the base 71. A common wire 113 is arranged on the top surface 71b of the base 71 and is connected to the two common contacts 75 and the plurality of common contacts 76a. Note that the COF 111 is not provided with the common contacts 76b (see FIG. 6) in the second modification.

The individual wires 112 are connected to the corresponding individual contacts 72 and extend rightward from their connection portions with the individual contacts 72. The common wire 113 has a portion 113a that extends in the conveying direction over the plurality of common contacts 76a, and two portions 113b that respectively extend rightward in the scanning direction from both ends of the portion 113a in the conveying direction. The two portions 113b are also connected to the two corresponding common contacts 75 that are led onto the top surface 71b of the base 71.

In the second modification, the common contacts 76b separated farther than the individual contacts 72 from the edge 71c of the base 71 are omitted from the COF 111, while the common contacts 76a are arranged at positions closer than the individual contacts 72 to the edge 71c of the base 71. The individual wires 112 extend from their connection portions with the individual contacts 72 toward positions opposite the common contacts 76a with respect to the individual contacts 72. That is, the individual wires 112 extend from their connection portions with the individual contacts 72 in a direction away from the edge 71c of the base 71. With this arrangement, the individual wires 112 can extend linearly to the driver IC 74 without being routed around the common contacts 76a.

<Third Modification>

A third modification of the embodiment will be described with reference to FIGS. 14 through 16, wherein like parts and components are designated by the same reference numerals as those of the above-described embodiment and modifications to avoid duplicating description.

Figure 14:
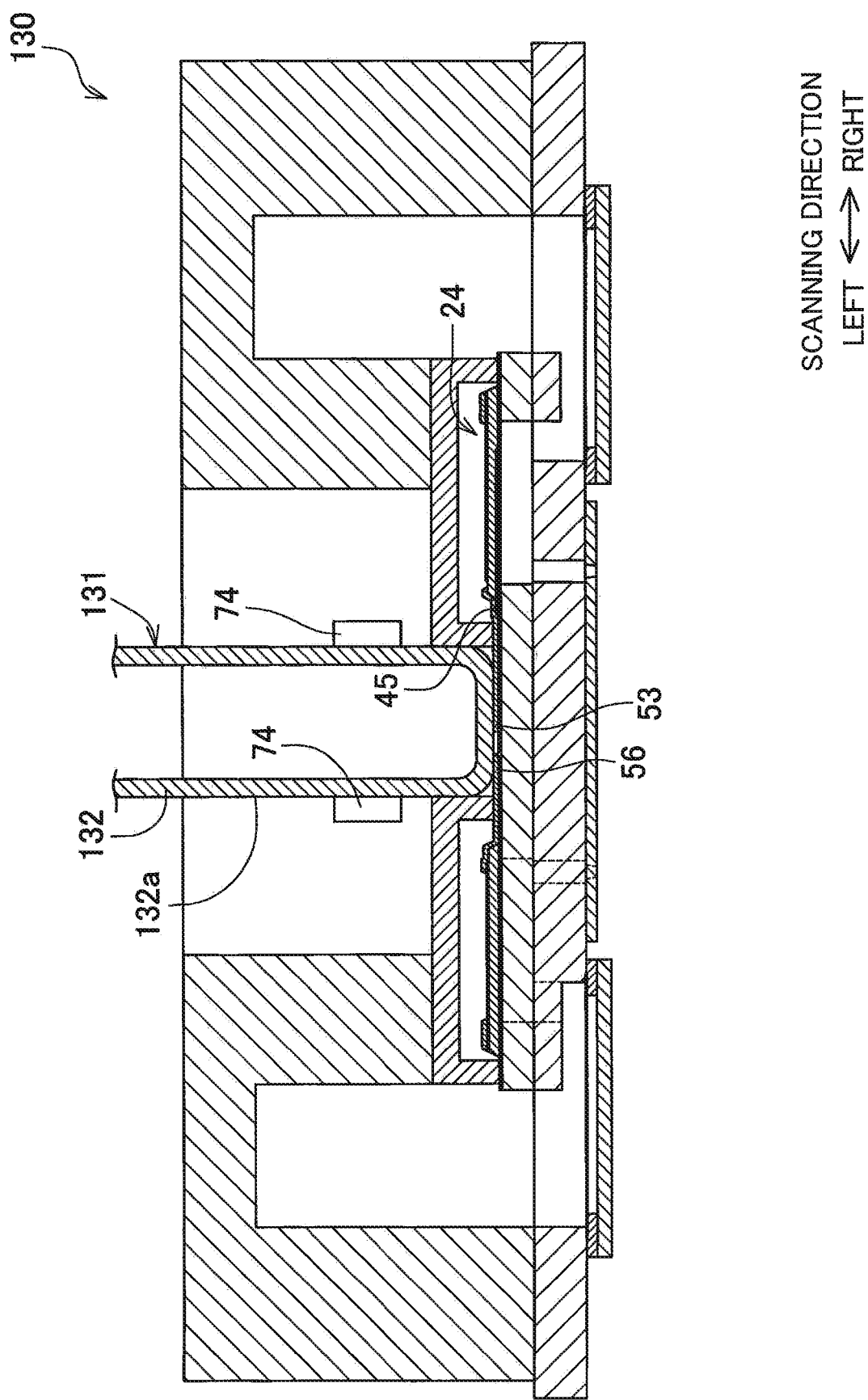
FIG. 14 is a cross-sectional view of a head unit 130 according to a third modification, which corresponds to the cross-sectional view illustrated in FIG. 5.
Figure 15:
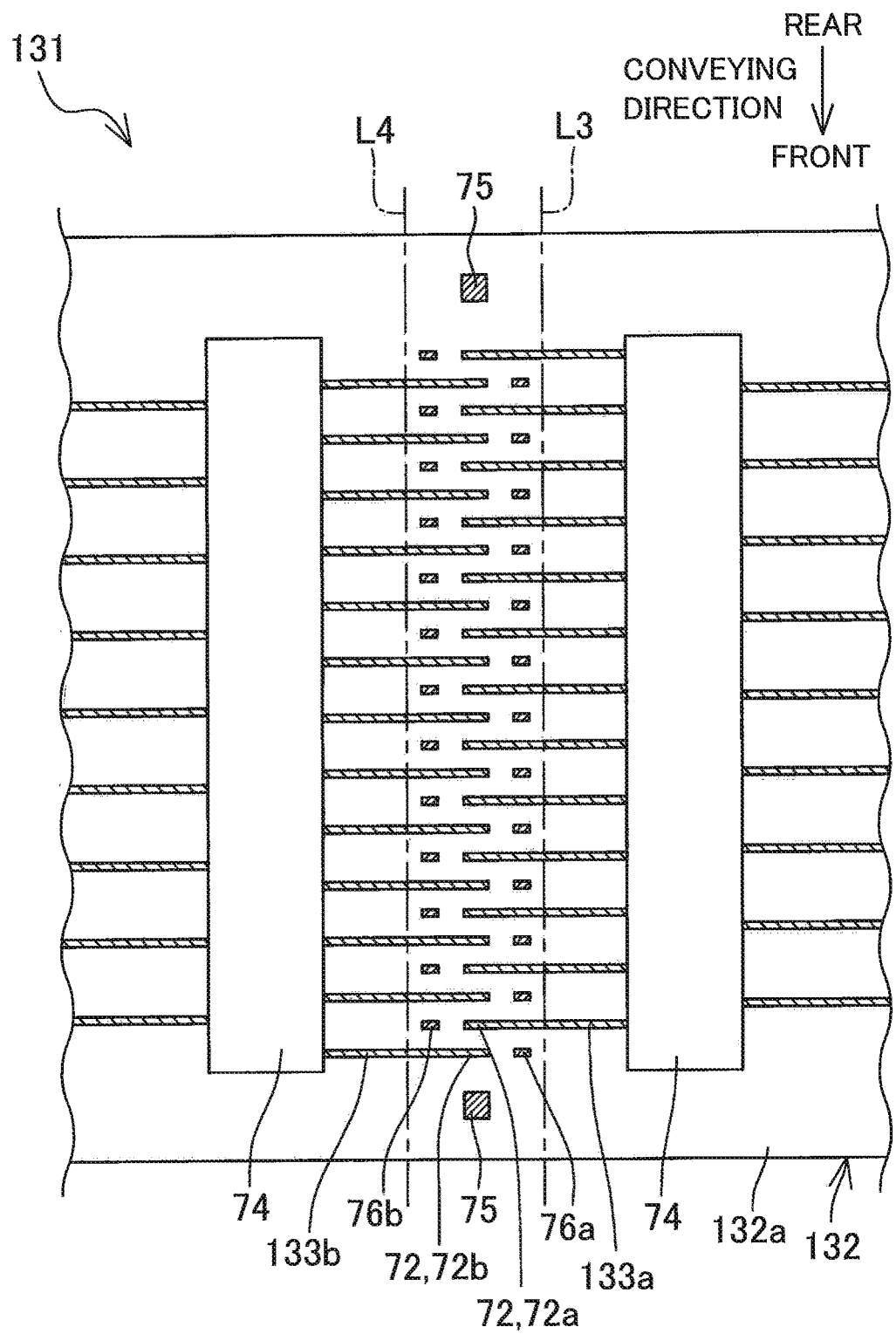
FIG. 15 is a plan view of a bottom surface 132a of a base 132 of a COF 131 according to the third modification.
Figure 16:
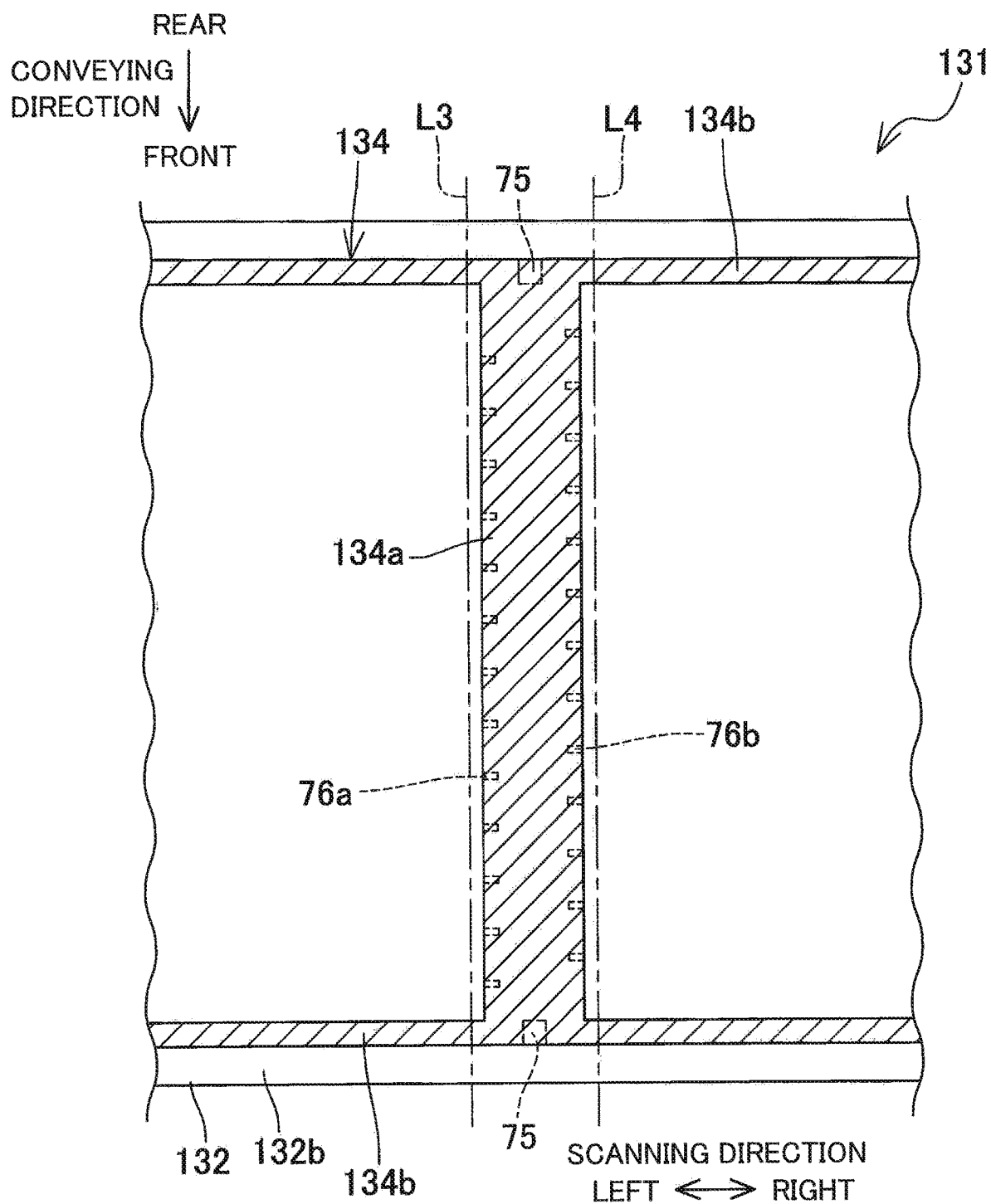
FIG. 16 is a plan view of a top surface 132b of the base 132 of the COF 131 according to the third modification.

As illustrated in FIGS. 14 through 16, a head unit 130 according to the third modification includes a COF 131.

In the embodiment described above, the COF 25 extends outward from its area bonded to the piezoelectric actuator 24 only toward one side in the scanning direction.

However, in the head unit 130 according to third modification, a base 132 of the COF 131 extends outward from its area bonded to the piezoelectric actuator 24 toward both sides in the scanning direction. The base 132 is bent at a midpoint of the base 132 on each side of the area bonded to the piezoelectric actuator 24 and extends upward therefrom. More specifically, the base 132 is bent upward at a fold line L3 positioned immediately leftward of the common contacts 76a and at a fold line L4 positioned immediately rightward of the common contacts 76b, as illustrated in FIGS. 15 and 16. With this arrangement, the contacts 72 (72a and 72b), 75, 76a, and 76b are arranged on the middle portion of the COF 131 in the third modification. The driver ICs 74 are mounted on a bottom surface 132a of the base 132 in regions positioned on both sides of the area of the base 132 bonded to the piezoelectric actuator 24 in the scanning direction.

As illustrated in FIG. 15, individual wires 133a connected to individual contacts 72a are arranged on the bottom surface 132a of the base 132 in the third modification. The individual wires 133a extend linearly to the left driver IC 74 through regions between neighboring common contacts 76a. Similarly, individual wires 133b connected to individual contacts 72b are arranged on the bottom surface 132a of the base 132. The individual wires 133b extend linearly to the right driver IC 74 through regions between neighboring common contacts 76b. In other words, in the third modification, the individual wires 133a connected to the individual contacts 72a and the individual wires 133b connected to the individual contacts 72b extend from their connection portions with the corresponding individual contacts 72a and 72b toward opposite sides from each other in the scanning direction. The individual wires 133a constitutes a first individual wire group and the individual wires 133b constitutes a second individual wire group.

Since the individual contacts 72a are positioned between neighboring common contacts 76a in the conveying direction in this modification, the individual wires 133a can be extended linearly from the individual contacts 72a to the corresponding driver IC 74. In other words, there is no need to route the individual wires 133a so as to skirt around the common contacts 76a. Similarly, since the individual contacts 72b are positioned between neighboring common contacts 76b in the conveying direction, the individual wires 133b can be extended linearly from the individual contacts 72b to the corresponding driver IC 74. In other words, there is no need to route the individual wires 133b so as to skirt around the common contacts 76b.

As illustrated in FIG. 16, the common contacts 75, 76a, 76b are led onto a top surface 132b of the base 132 in the third modification. The common wire 134 is arranged on the top surface 132b of the base 132. The common wire 134 has a portion 134a that expands in the scanning direction and the conveying direction over the common contacts 75, 76a, 76b, and two portions 134b that respectively extend toward both sides of the portion 134a in the scanning direction from both ends of the portion 134a in the conveying direction.

<Fourth Modification>

A fourth modification of the embodiment will be described with reference to FIG. 17, wherein like parts and components are designated by the same reference numerals as those of the above-described embodiment and modifications to avoid duplicating description.

In the above-described embodiment, the common contacts 56 are respectively positioned on extension lines extending from the individual contact 53 of all the individual wires 52.

Figure 17:
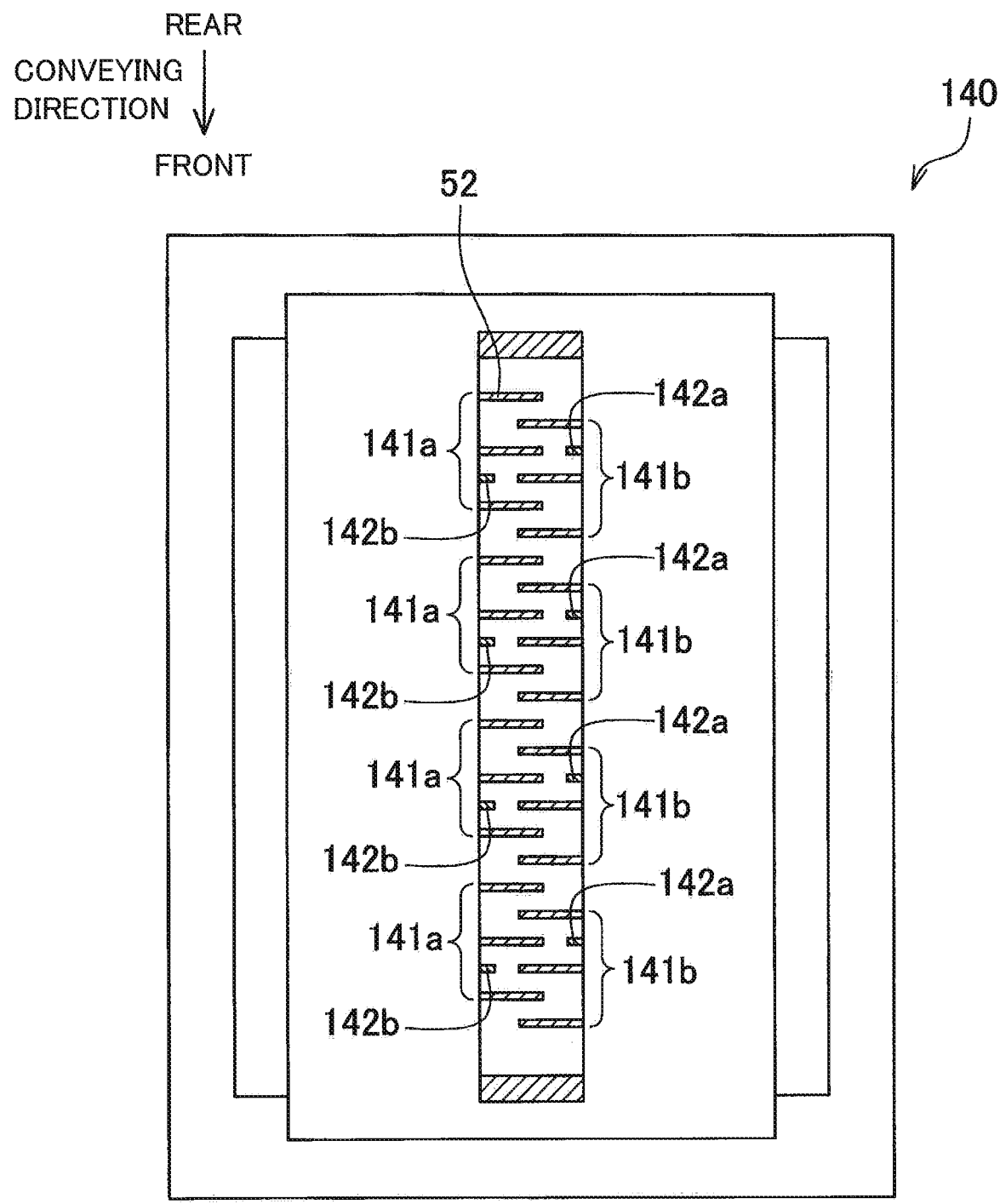
FIG. 17 is a plan view of a head unit 140 according to a fourth modification, from which the ink supply member 27 and the protective member 26 are omitted.

In a head unit 140 according to the fourth modification, the individual wires 52 led out from the piezoelectric element row 39a are divided into four wire groups 141a arrayed in the conveying direction, as illustrated in FIG. 17. Each wire group 141a is configured of three neighboring individual wires 52 led out from the piezoelectric element row 39a. Further, a common contact 142a led out from the piezoelectric element row 39b is positioned only on the extension line of the individual contact 53 of one individual wire 52 in each wire group 141a, and specifically the one individual wire 52 is the center individual wire 52 of the wire group 141a in the conveying direction.

Similarly, in the fourth modification, the individual wires 52 led out from the piezoelectric element row 39b are divided into four wire groups 141b arrayed in the conveying direction. Each wire group 141b is configured of three neighboring individual wires 52 led out from the piezoelectric element row 39b. A common contact 142b led out from the piezoelectric element row 39a is positioned only on the extension line of the individual contact 53 of one individual wire 52 in each wire group 141b, and specifically the one individual wire 52 is the center individual wire 52 of the wire group 141b in the conveying direction.

Even a configuration such as that described in the fourth modification having the common contacts 142a and 142b positioned only on the extension lines extending from the individual contacts 53 of some of the individual wires 52 can suppress variations in potential throughout the common electrodes 49. Further, since the fourth modification uses fewer common wires than the configuration of the embodiment described above, the density of wires and contacts in the piezoelectric actuator can be reduced.

Note that the number of respective wire groups 141a and 141b may be set to two, three, or five or more and is not limited to four. Further, the number of individual wires 52 configuring each of the wire groups 141a and 141b may be two or four or more and is not limited to three. In addition, the number of individual wires 52 configuring each wire group 141a may differ from the number of individual wire 52 configuring each wire group 141b.

Further, while the common contacts 142a and 142b are respectively positioned on the extension lines of the individual contacts 53 of the individual wires 52 positioned in the centers of the wire groups 141a and 141b in the conveying direction, the common contacts 142a and 142b may be respectively positioned on the extension lines of the individual contact 53 of the individual wires 52 of the wire groups 141a and 141b other than the center individual wires 52 in the conveying direction.

<Fifth Modification>

A fifth modification of the embodiment will be described with reference to FIG. 18, wherein like parts and components are designated by the same reference numerals as those of the above-described embodiment and modifications to avoid duplicating description.

In the embodiment described above, the individual contacts 53 led out from the two piezoelectric element rows 39a and 39b are arrayed in the conveying direction, the common contacts 56a are arrayed in the conveying direction at positions leftward of the individual contacts 53, and the common contacts 56b are arrayed in the conveying direction at positions rightward of the individual contacts 53. In other words, in the piezoelectric actuator 24 according to the embodiment described above, a total of three contact rows, including a row of individual contacts 53, a row of common contacts 56a, and a row of common contacts 56b, are juxtaposed in the scanning direction.

Figure 18:
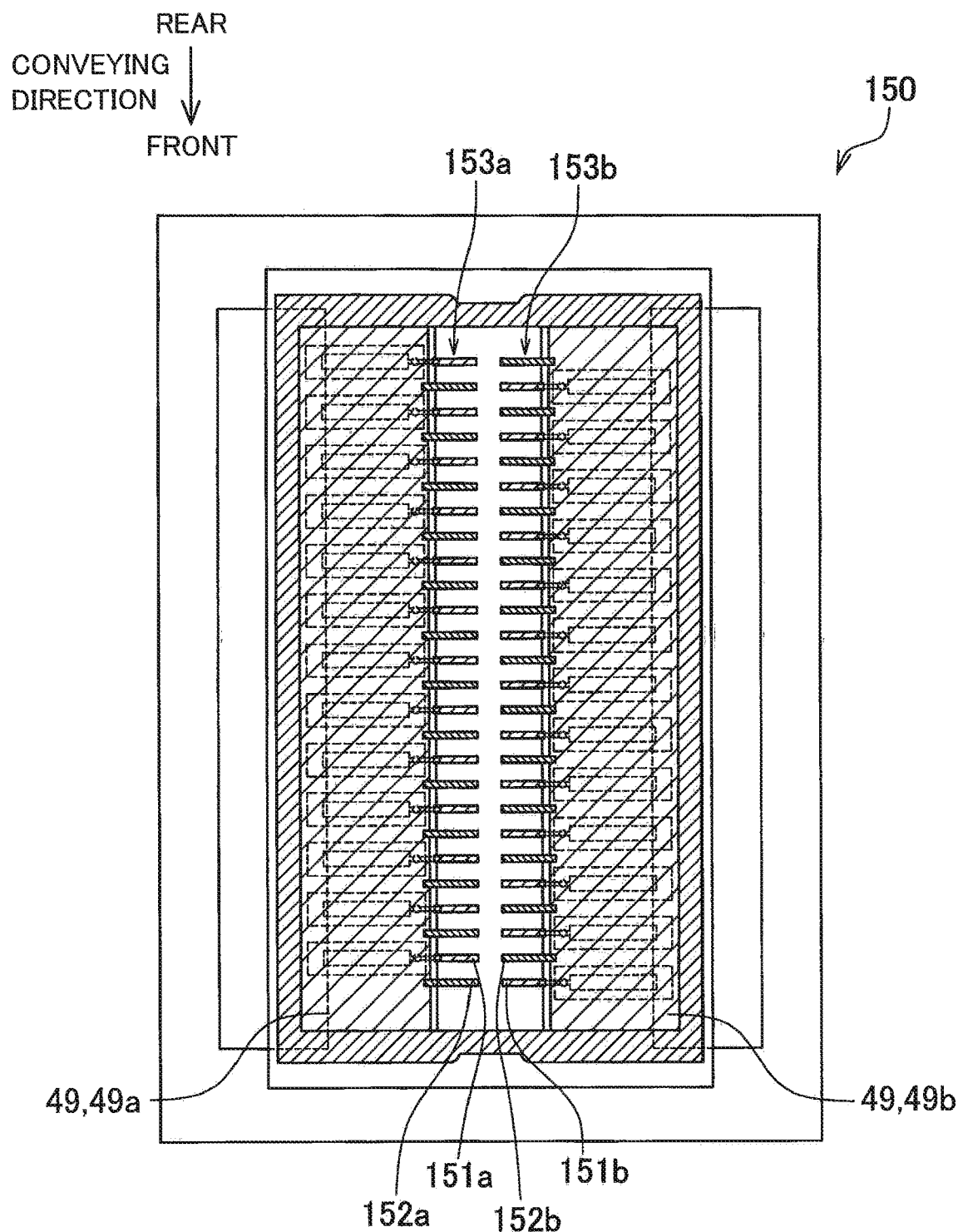
FIG. 18 is a plan view of a head unit 150 according to a fifth modification, from which the ink supply member 27 and the protective member 26 are omitted.

However, as illustrated in FIG. 18, in a head unit 150 according to the fifth modification, a plurality of individual contacts 151a and a plurality of common contacts 152a both led out from the piezoelectric element row 39a are alternated with each other in the conveying direction to form a single contact row 153a (an example of a first contact row) extending in the conveying direction. Similarly, a plurality of individual contacts 151b and a plurality of common contacts 152b both led out from the piezoelectric element row 39b are alternated with each other in the conveying direction to form a single contact row 153b (an example of a second contact row) extending in the conveying direction. In other words, two contact rows juxtaposed in the scanning direction are formed by alternatingly arranging the individual contacts 151a and 151b and the common contacts 152a and 152b respectively in the fifth modification. In this modification, the common contacts 152b are positioned on extension lines passing through the individual contacts 151a that extend in longitudinal directions thereof, while the common contacts 152a are positioned on extension lines passing through the individual contacts 151b that extend in longitudinal directions thereof.

Since the configuration of the fifth modification has fewer contact rows juxtaposed in the scanning direction than the configuration of the embodiment described above, the area allocated for disposing the contacts used to establish connections between the piezoelectric actuator 24 and the COF 25 can be made smaller in the scanning direction, thereby reducing the surface area for the portion of the COF 25 bonded to the piezoelectric actuator 24.

<Sixth Modification>

A sixth modification of the embodiment will be described with reference to FIGS. 19 through 22, wherein like parts and components are designated by the same reference numerals as those of the above-described embodiment and modifications to avoid duplicating description.

In the embodiment and modifications described above, the individual contacts are arranged in a region between two piezoelectric element rows 39a and 39b. However, other configurations are conceivable.

Figure 19:
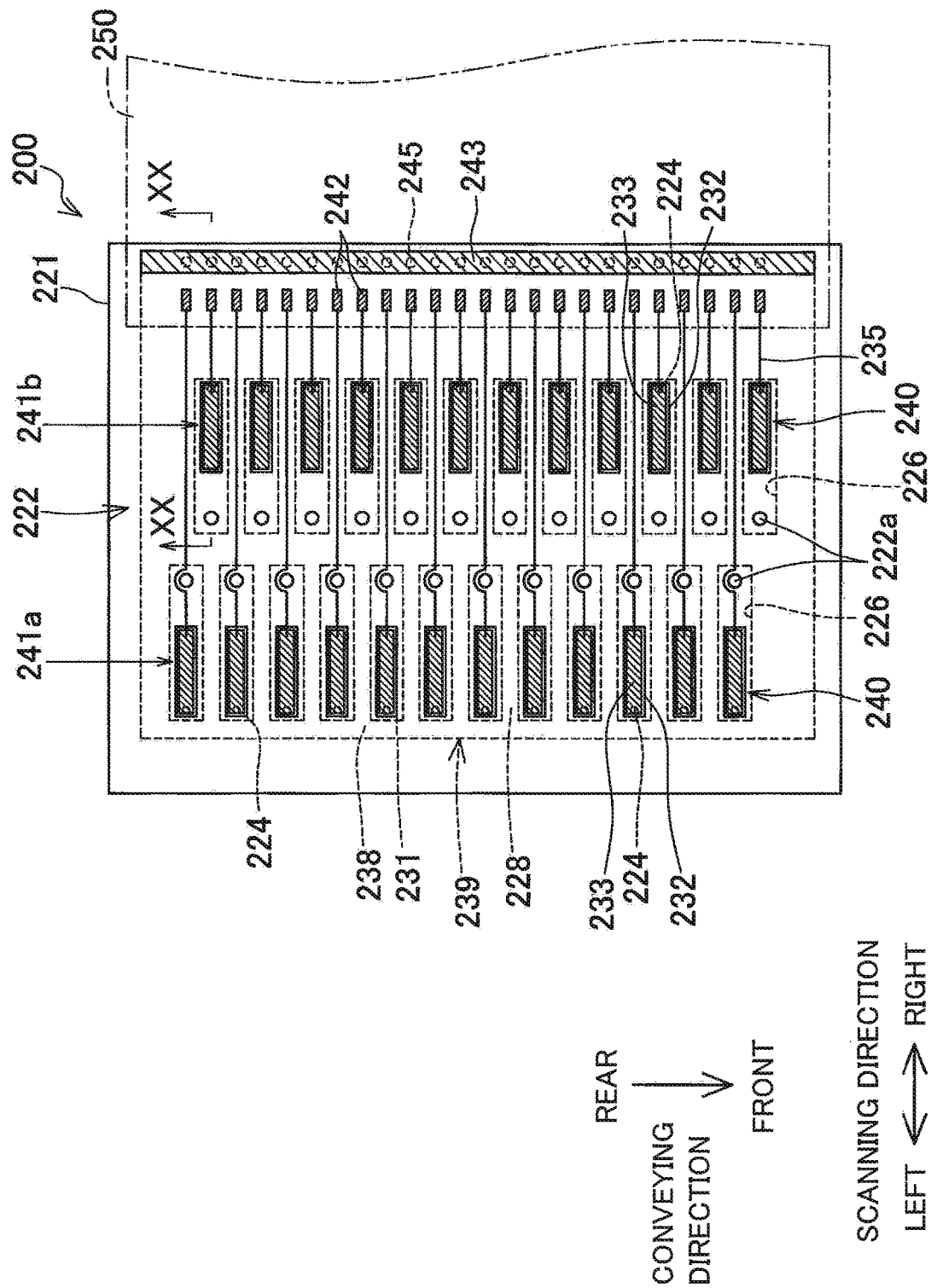
FIG. 19 is a plan view of a head unit 200 according to a sixth modification.
Figure 20:
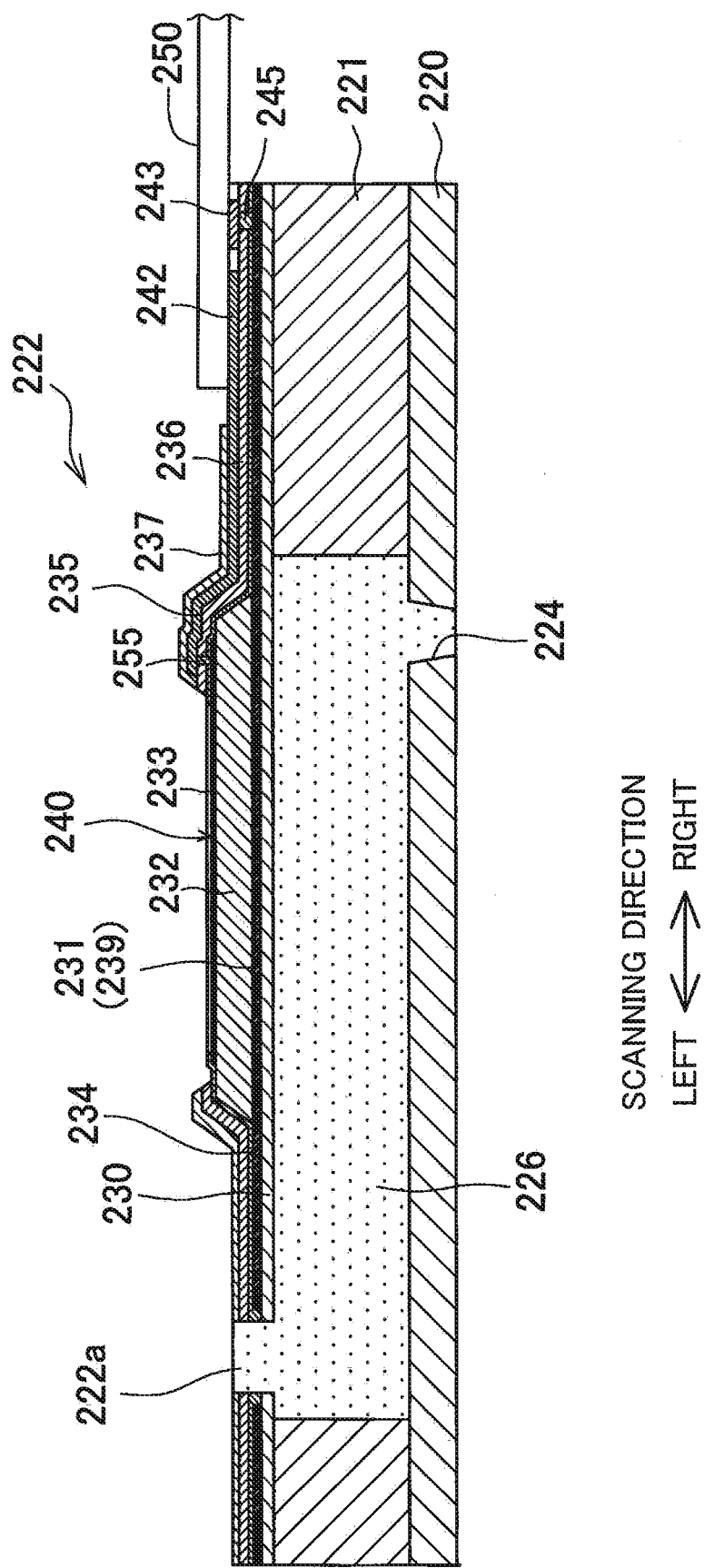
FIG. 20 is a cross-sectional view of the head unit 200 according to the sixth modification taken along a line XX-XX in FIG. 19.

As illustrated in FIGS. 19 and 20, a head unit 200 according to the sixth modification includes a channel substrate 221, a nozzle plate 220, and a piezoelectric actuator 222 (an example of an actuator).

The channel substrate 221 has a plurality of pressure chambers 226 formed therein. The nozzle plate 220 is a thin plate-shaped member in which a plurality of nozzles 224 is formed. The nozzle plate 220 is bonded to a bottom surface of the channel substrate 221. The piezoelectric actuator 222 is disposed on a top surface of the channel substrate 221. The piezoelectric actuator 222 includes a vibrating film 230, a plurality of piezoelectric elements 240 (an example of driving elements), a protective film 234, an interlayer insulating film 236, individual wires 235, and a wire protection film 237.

A plurality of communication holes 222a is formed in the piezoelectric actuator 222. The communication holes 222a are formed at positions overlapping ends of corresponding pressure chambers 226. The ends of the pressure chambers 226 at which the communication holes 222a are formed are the farther ends in the scanning direction from the nozzles 224. Ink is supplied into the pressure chambers 226 through the corresponding communication holes 222a.

The vibrating film 230 is disposed over the entire top surface of the channel substrate 221 so as to cover the pressure chambers 226. The piezoelectric elements 240 are respectively disposed on the vibrating film 230 at positions overlapping the pressure chambers 226. That is, the vibrating film 230 is interposed between the pressure chambers 226 and the piezoelectric elements 240. Each piezoelectric element 240 includes a lower electrode 231 (an example of a second electrode), a piezoelectric film 232, and an upper electrode 233 (an example of a first electrode).

The lower electrode 231 is formed on a top surface of the vibrating film 230 in a region overlapping the corresponding pressure chamber 226. As illustrated in FIG. 19, a conductive film 238 is also formed on the vibrating film 230 in an area between neighboring pressure chambers 226. The conductive film 238 is formed of the same material used to form the lower electrode 231. The conductive film 238 enables the lower electrodes 231 to be electrically connected to each other in all of the piezoelectric elements 240. The lower electrodes 231 and the conductive film 238 between all neighboring lower electrodes 231 constitute a single large common electrode 239 occupying substantially the entire top surface of the vibrating film 230.

The piezoelectric film 232 is formed on the lower electrode 231 in a region that the vibrating film 230 opposes the pressure chamber 226. The piezoelectric film 232 has a rectangular planar shape that is elongated in the scanning direction and that is smaller than the pressure chamber 226.

The upper electrode 233 has a rectangular planar shape that is slightly smaller than the piezoelectric film 232. The upper electrode 233 is formed in a center region on a top surface of the piezoelectric film 232.

The protective film 234 is formed over substantially the entire top surface of the vibrating film 230 across the piezoelectric films 232 of all the piezoelectric elements 240.

The interlayer insulating film 236 is formed on the protective film 234. The plurality of individual wires 235 (an example of first individual wires) are arranged on the interlayer insulating film 236. One end portion of each individual wire 235 is arranged so as to hang over a top surface of a right end portion of the corresponding piezoelectric film 232 with the protective film 234 and the interlayer insulating film 236 interposed therebetween. A through-hole 255 is formed in regions of the protective film 234 and the interlayer insulating film 236 that cover a right end portion of the upper electrode 233, penetrating these films. The individual wire 235 and the right end portion of the upper electrode 233 are electrically connected to each other via the through-hole 255. The individual wires 235 for the corresponding piezoelectric elements 240 are led rightward from the upper electrodes 233, respectively.

The piezoelectric elements 240 are configured of two left and right piezoelectric element rows 241a and 241b each extending in the conveying direction. The piezoelectric element rows 241a and 241b are juxtaposed with each other in the scanning direction. The individual wires 235 led out from the left piezoelectric element row 241a are arranged on the interlayer insulating film 236 between the piezoelectric elements 240 constituting the right piezoelectric element row 241b. That is, individual wires 235 connected to the left piezoelectric elements 240 extend rightward, passing over partitions 228 (see FIG. 19) between neighboring pairs of right piezoelectric elements 240.

The interlayer insulating film 236 arranged beneath the individual wires 235 is formed so as to reach a right edge of the channel substrate 221. A plurality of individual contacts 242 (an example of first individual contacts) is arranged on the interlayer insulating film 236. The individual contacts 242 are arrayed in the conveying direction at positions on a right edge portion of the channel substrate 221. The individual wires 235 led rightward from the upper electrodes 233 are connected to the corresponding individual contacts 242. Further, a common contact 243 (an example of a first common contact) is arranged on the right edge portion of the channel substrate 221. The common contact 243 extends in the conveying direction at a position farther rightward than the individual contacts 242. With this arrangement, the common contact 243 is positioned over all extension lines passing through the individual contacts 242 that extend in longitudinal directions of the individual wires 235. The common electrode 239, on the other hand, extends rightward to a position opposing the common contact 243. The common contact 243 is connected to the common electrode 239 via a plurality of through-holes 245 that penetrate the protective film 234 and the interlayer insulating film 236. The through-holes 245 are formed in the protective film 234 and the interlayer insulating film 236 at positions falling on the extension lines extending from the individual contacts 242 of the individual wires 235.

The wire protection film 237 is formed on the interlayer insulating film 236 so as to cover the plurality of individual wires 235. The wire protection film 237 extends toward the right edge of the channel substrate 221 and covers portions of the individual wires 235 up to areas in which the individual wires 235 are connected to the individual contacts 242. The individual contacts 242 and the common contact 243 are not covered by the wire protection film 237 but are exposed to an outside beyond an edge of the wire protection film 237.

Figure 21:
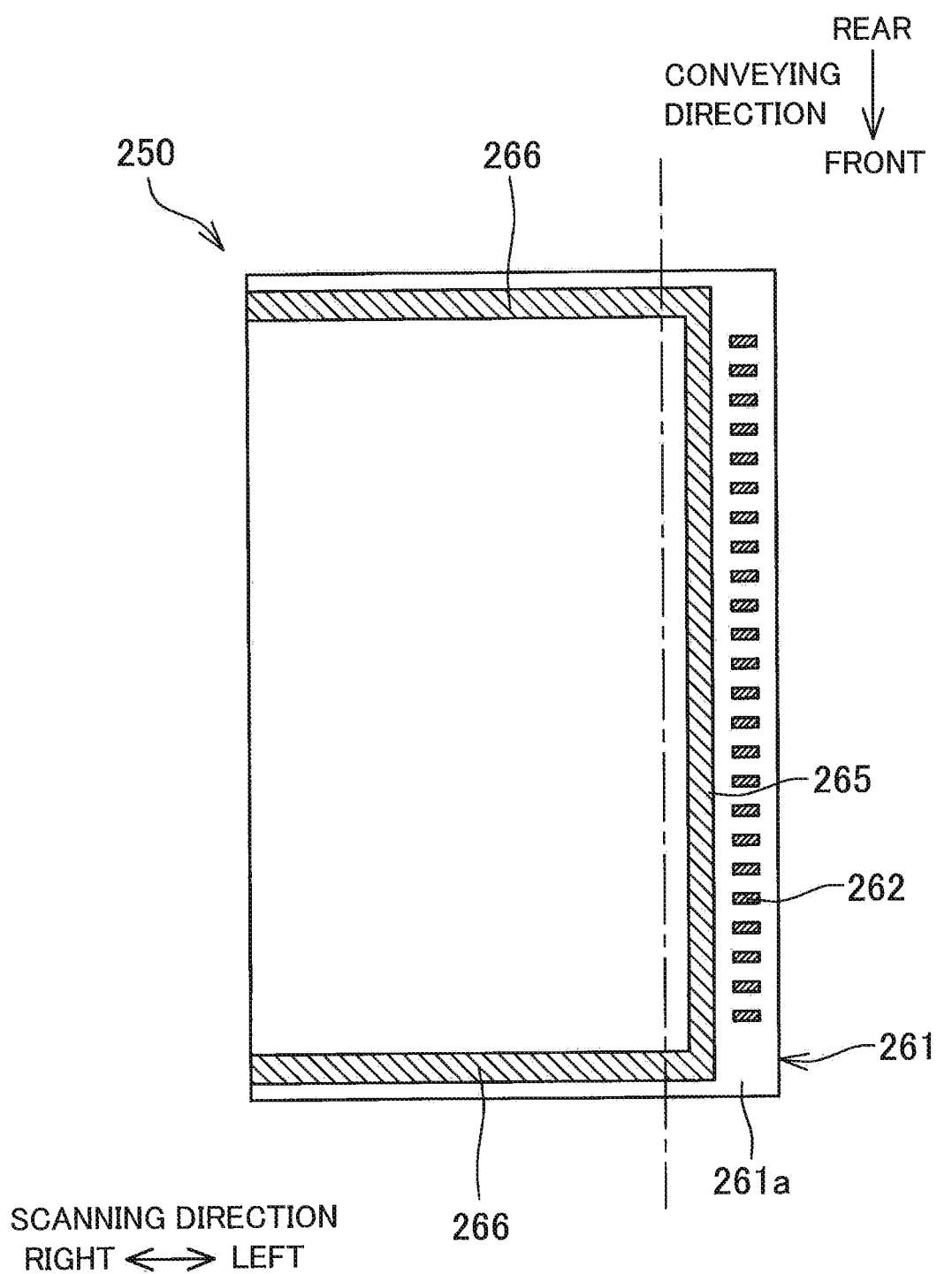
FIG. 21 is a plan view of a bottom surface 261a of a base 261 of a COF 250 according to the sixth modification.
Figure 22:
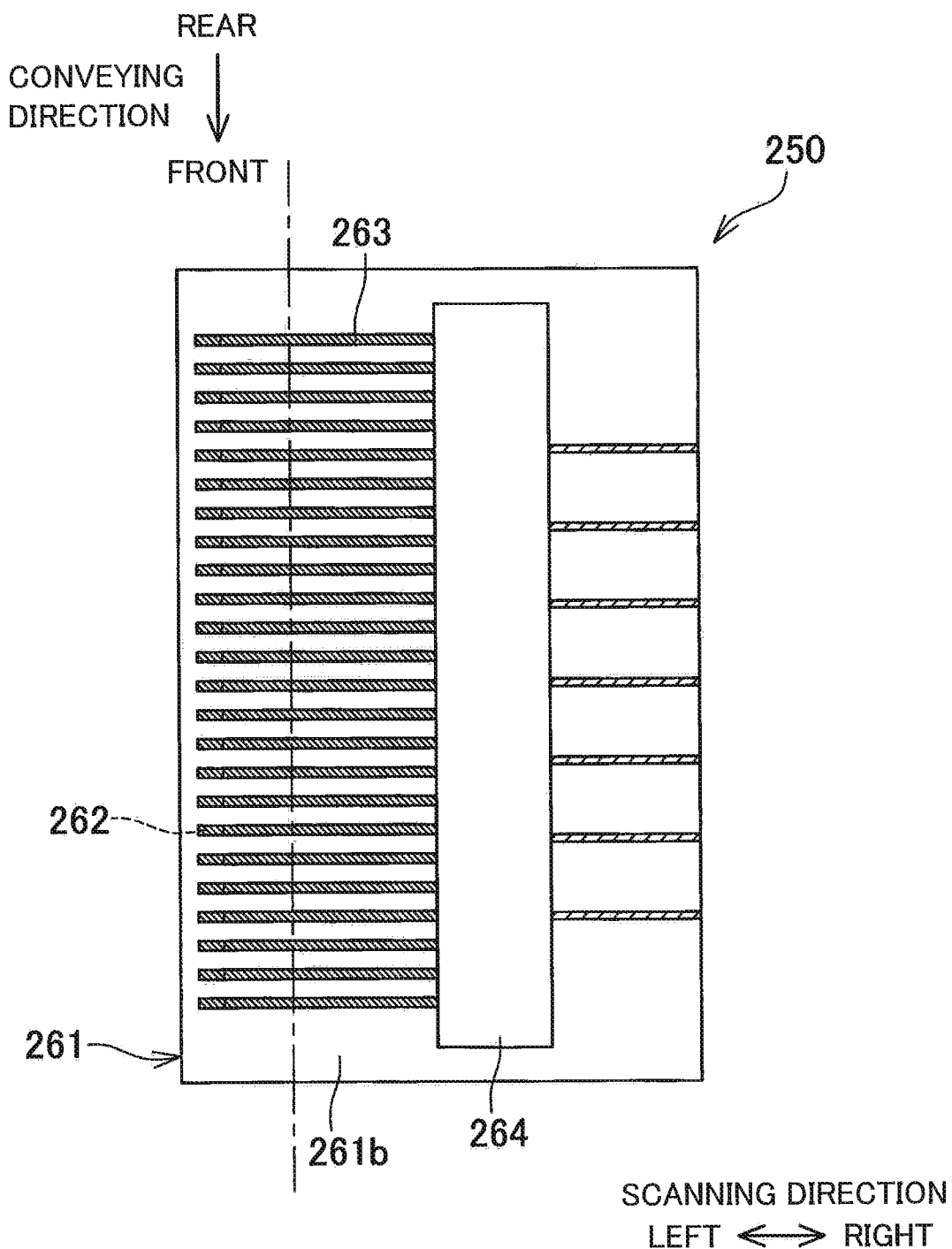
FIG. 22 is a plan view of a top surface 261b of the base 261 of the COF 250 according to the sixth modification.

As illustrated in FIGS. 19 and 20, a COF 250 (an example of a wiring member) is bonded to a top surface on a right edge portion of the piezoelectric actuator 222. As illustrated in FIGS. 21 and 22, the COF 250 includes a base 261, a plurality of individual contacts 262 (an example of second individual contacts), a plurality of individual wires 263 (an example of a second individual wires), a driver IC 264, a single common contact 265 (an example of a second common contact), and two common wires 266 (an example of second common wires).

The base 261 is a film-like member formed of a synthetic resin material such as polyimide, or the like. The individual contacts 262 are arranged on a bottom surface 261a of the base 261 in regions opposing the individual contacts 242 and are connected to the individual contacts 242. The individual contacts 262 are led onto a top surface 261b of the base 261 via through-holes (not illustrated) formed in the base 261. The individual wires 263 are arranged on the top surface 261b of the base 261. The individual wires 263 are provided in correspondence with the individual contacts 262, respectively. The individual wires 263 are respectively connected to the individual contacts 262 led onto the top surface 261b of the base 261. The individual wires 263 extend rightward in the scanning direction from their connection portions with the individual contacts 262. The individual wires 263 have one end portions, and the other end portions opposite the one end portions and connected to the individual contacts 262. The one end portions of the individual wires 263 are connected to the driver IC 264 disposed on the top surface 261b of the base 261.

The common contact 265 extends in the conveying direction and is arranged on the bottom surface 261a of the base 261 in a region opposing the common contact 243. The common contact 265 is connected to the common contact 243. The common wires 266 are arranged on the bottom surface 261a of the base 261. The common wires 266 are respectively connected to each end of the common contact 265 in the conveying direction and extend rightward in the scanning direction from their connection portions with the common contact 265.

In the head unit 200 according to the sixth modification, the common contact 243 extending in the conveying direction is positioned over the extension lines passing through the individual contacts 242 that extend in the longitudinal directions of the individual wires 235. Further, the common electrode 239 and the common contact 243 are connected to each other via the through-holes 245 arrayed in the conveying direction. Hence, this arrangement can maintain a uniform potential throughout the common electrode 239 without widening gaps between the piezoelectric elements 240.

Further, in the embodiment described above, the plurality of individual wires 52 and the pluralities of individual contacts 53 of the piezoelectric actuator 24 and the plurality of individual contacts 72 of the COF 25 are arrayed in the conveying direction while the COF 25 extends in the scanning direction from its area bonded to the piezoelectric actuator 24. However, for example, the individual wires 52 may be arrayed in the conveying direction (an example of a first direction), while the individual contacts 53 and the individual contacts 72 are arrayed in a direction oblique to the conveying direction (an example of a third direction). Further, the COF 25 may extend from its area bonded to the piezoelectric actuator 24 in a fourth direction that crosses the third direction. In this case, the fourth direction may be parallel to the scanning direction (an example of a second direction) or may be a direction oblique to the scanning direction. Alternatively, the third direction may be parallel to the conveying direction while the fourth direction is oblique to the scanning direction.

Further, in the embodiment described above, the longitudinal directions of the individual wires 52 are parallel to the scanning direction. However, the longitudinal directions of the individual wires 52 may be oblique to the scanning direction. In this case, the oblique angle that the longitudinal direction of each individual wire 52 forms with the scanning direction may differ among the individual wires 52. Here, the common contacts 56 may be positioned on extension lines of the individual contact 53 of the individual wires 52 that extend in the longitudinal directions and that are oblique to the scanning direction.

In the embodiment described above, the spacing D1 in the scanning direction between each individual contact 53 and the corresponding common contact 56 is greater than the clearance D2 in the conveying direction between neighboring individual contacts 53. However, the spacing D1 may be set smaller than or equal to the clearance D2.

In the embodiment described above, the common contacts 56 are arranged on the top surface of the vibrating film 40, which is the same surface on which the individual contacts 53 are arranged. However, for example, the individual contacts 53 and the common contacts 56 may both be arranged on a surface of the vibrating film 40 other than the top surface of the vibrating film 40. Alternatively, the common contacts 56 may be arranged on the top surfaces of the piezoelectric films 43 or any surface other than the surface on which the individual contacts 53 are arranged.

In the embodiment described above, the protective member 26 is disposed on the top surface of the piezoelectric actuator 24 while the contacts 53, 54, and 56 are arranged at positions not overlapping the protective member 26. However, for example, the protective member 26 need not be disposed on the top surface of the piezoelectric actuator 24.

In the embodiment described above, the piezoelectric actuator 24 and the COF 25 are joined together through the NCF bonding. However, for example, the piezoelectric actuator 24 and the COF 25 may be joined together through ACF bonding in which an anisotropic conductive film (ACF) is arranged between the piezoelectric actuator 24 and the COF 25 and the COF 25 is heated while being pressed against the piezoelectric actuator 24. This process allows portions of the ACF interposed between the corresponding contacts to have electrically conductive properties, so that the contacts can be electrically connected to each other through the ACF bonding.

In the embodiment and modifications described above, excluding the sixth modification, the lower electrodes 42 of the piezoelectric elements 41 may be connected together to form a common electrode, while the upper electrodes 44 may be used as individual electrodes. In this case, the upper electrodes 44 are an example of first electrodes, while the lower electrodes 42 are an example of second electrodes.

In the embodiment and modifications described above, the piezoelectric actuator includes two piezoelectric element rows 39a and 39b juxtaposed in the scanning direction. However, the piezoelectric actuator may have a single row of piezoelectric elements instead.

The actuator device according to the embodiment and modifications described above, the COF is bonded to the piezoelectric actuator, and the piezoelectric actuator includes the piezoelectric elements having the piezoelectric films interposed between the first electrodes and the second electrodes. However, the actuator device may include an actuator provided with driving elements other than piezoelectric elements that have first electrodes and second electrodes, and a wiring member connected to the actuator.

Further, the actuator device may not be used in an inkjet heads. The actuator device may also be used in devices other than inkjet heads.

The present disclosure exemplified in the embodiments, modification and examples described above may be summarized as follows.

(1) According to one aspect, the disclosure provides an actuator device including: an actuator; and a wiring member. The actuator includes: a plurality of driving elements; a plurality of first individual wires; a plurality of first individual contacts; and a first common contact. The plurality of driving elements each includes a first electrode and a second electrode. The plurality of driving elements is arrayed in a first direction on a plane. The second electrodes are electrically connected to each other to provide a common electrode. The plurality of first individual wires each extends from each of the first electrodes in a second direction crossing the first direction and in parallel to the plane. The plurality of first individual wires is arrayed in the first direction at intervals between neighboring first individual wires. The plurality of first individual contacts is each provided at a distal end portion of each of the plurality of first individual wires. The first common contact extends from the common electrode and positioned on an extension line extending in the second direction from at least one of the plurality of first individual contacts. The wiring member is connected to the plurality of first individual contacts and the first common contact.

With this configuration, the first common contact is positioned on the extension line extending in the second direction from at least one of the first individual contacts. This configuration can suppress variation in potential at different points in the common electrode without widening gaps between neighboring driving elements.

(2) In the actuator device according to the aspect (1), it is preferable that: the plurality of driving elements includes a first row of the driving elements and a second row of the driving elements, the first row and the second row being juxtaposed with each other in the second direction, each of the driving elements constituting the first row being offset in the first direction from each of the driving elements constituting the second row; the plurality of first individual wires includes a first group of the first individual wires each extending from each of the first electrodes of the driving elements constituting the first row into an area between the first row and the second row, and a second group of the first individual wires each extending from each of the first electrodes of the driving elements constituting the second row into the area between the first row and the second row; and the first individual wires constituting the first group and the first individual wires constituting the second group are arranged so as to be alternated with each other in the first direction.

According to the above-described configuration, the positions of the first individual wires in the conveying direction are offset between the first group and the second group. Thus, regions positioned on the extension lines of the first individual contacts provided at the first individual wires constituting the first group can form space between neighboring pairs of first individual wires constituting the second group. Similarly, regions positioned on the extension lines of the first individual contacts provided at the first individual wires constituting the second group can form space between neighboring pairs of first individual wires constituting the first group.

(3) In the actuator device according to the aspect (2), it is preferable that the common electrode includes: a first common electrode provided by the second electrodes of the driving elements constituting the first row electrically connected to each other; and a second common electrode provided by the second electrodes of the driving elements constituting the second row electrically connected to each other. The actuator device may further include a plurality of first common wires each extending from the first common electrode into the area between the first row and the second row. Preferably, the first common contact includes a plurality of first common contact parts each being provided at a distal end portion of each of the plurality of first common wires and positioned on an extension line extending from one of the first individual contacts provided at the first individual wire constituting the second group.

With the above-described configuration, the actuator device includes the plurality of first common wires led out from the first common electrode at a plurality of locations in the first direction. Thus, the first common electrode is connected to the first common contact parts provided at the distal end portions of the first common wires. This arrangement can suppress variation in potential among different areas of the first common electrode.

Further, the space between neighboring pairs of first individual wires constituting the second group are used for arranging the first common wires.

Still further, the first individual wires extend into the area between the first row and the second row, and the first common wires extend into the area between the first row and the second row. That is, the first individual contacts and the first common contact parts are positioned in the area between the first row and the second row. This configuration can reduce the area of connections between the actuator and the wiring member by concentrating the first individual contacts and the first common contact parts in one location.

(4) In the actuator device according to the aspect (3), preferably, the plurality of first common contact parts is each positioned between neighboring first individual wires constituting the first group in the first direction.

With this configuration, the first common contact parts are positioned on the extension lines extending in the second direction from the first individual contacts provided at the first individual wires constituting the second group and also positioned between neighboring first individual wires constituting the first group in the first direction. Thus, without increasing the gaps between the first individual wires, the first common wires can be disposed at positions close to the first individual wires.

(5) In the actuator device according to the aspect (3) or the aspect (4), preferably, the wiring member includes: a base having a surface opposing the actuator; a plurality of second individual contacts arranged on the surface of the base and each connected to each of the plurality of first individual contacts; a plurality of second common contacts arranged on the surface of the base and each connected to each of the plurality of first common contact parts; a plurality of second individual wires each connected to each of the plurality of second individual contacts; and a second common wire connected to the plurality of second common contacts.

(6) In the actuator device according to the aspect (5), it is preferable that the plurality of first common wires and the plurality of first common contact parts extend exclusively from the first common electrode. Preferably, on the surface of the base, the plurality of second individual contacts includes: a first individual contact group of the second individual contacts each connected to each of the first individual contacts provided at the first individual wire constituting the first group; and a second individual contact group of the second individual contacts each connected to each of the first individual contacts provided at the first individual wire constituting the second group, the second individual contacts constituting the first individual contact group and the second individual contacts constituting the second individual contact group being arrayed in a third direction. Preferably, on the surface of the base, the plurality of second common contacts is disposed at a position juxtaposed with the second individual contacts constituting the second individual contact group in a fourth direction in parallel to the base and crossing the third direction.

With the above-described configuration, the plurality of first common contact parts is arranged exclusively at positions closer than the plurality of second individual contacts to an edge of the base. The plurality of second individual wires extends from the plurality of second individual contacts toward positions opposite the first common contact parts with respect to the plurality of second individual contacts. With this arrangement, the plurality of second individual wires can extend linearly without being routed around the first common contact parts.

(7) In the actuator device according to the aspect (2), preferably, the common electrode includes: a first common electrode provided by the second electrodes of the driving elements constituting the first row electrically connected to each other; and a second common electrode provided by the second electrodes of the driving elements constituting the second row electrically connected to each other. The actuator device may further include: a plurality of first common wires including: a first common wire group of the first common wires each extending from the first common electrode into the area between the first row and the second row; and a second common wire group of the first common wires each extending from the second common electrode into the area between the first row and the second row. Preferably, the first common contact includes a plurality of first common contact parts. The plurality of first common contact parts may include: a first contact group of the first common contact parts each provided at a distal end portion of each of the first common wires constituting the first common wire group and positioned on an extension line extending from one of the first individual contacts provided at the first individual wire constituting the second group; and a second contact group of the first common contact parts each provided at a distal end portion of each of the first common wires constituting the second common wire group and positioned on an extension line extending from one of the first individual contacts provided at the first individual wire constituting the first group.

(8) In the actuator device according to the aspect (7), it is preferable that the first individual contacts each provided at each of the first individual wires constituting the first group and the first common contact parts constituting the first contact group are alternated with each other in the first direction to form a first contact row. Preferably, the first individual contacts each provided at each of the first individual wires constituting the second group and the first common contact parts constituting the second contact group are alternated with each other in the first direction to form a second contact row. Preferably, the first contact row and the second contact row are arranged juxtaposed with each other in the second direction.

With the above-described configuration, the actuator device includes fewer contact rows juxtaposed in the scanning direction. Hence, the area allocated for disposing the first individual contacts and the first common contact parts used to establish connections between the actuator and the wiring member can be made smaller in the scanning direction, thereby reducing the area for connecting the wiring member and the actuator.

(9) In the actuator device according to the aspect (7) or aspect (8), preferably, the wiring member includes: a base having a surface opposing the actuator; a plurality of second individual contacts arranged on the surface of the base and each connected to each of the plurality of first individual contacts; a plurality of second common contacts arranged on the surface of the base and each connected to each of the plurality of first common contact parts; a plurality of second individual wires each connected to each of the plurality of second individual contacts; and a second common wire connected to the plurality of second common contacts.

(10) In the actuator device according to the aspect (9), it is preferable that, on the surface of the base, the plurality of second individual contacts includes: a first individual contact group of the second individual contacts each connected to each of the first individual contacts provided at the first individual wire constituting the first group; and a second individual contact group of the second individual contacts each connected to each of the first individual contacts provided at the first individual wire constituting the second group, the second individual contacts constituting the first individual contact group and the second individual contacts constituting the second individual contact group being arrayed in a third direction. Preferably, on the surface of the base, the plurality of second common contacts includes: a first common contact group of the second common contacts each connected to each of the first common contact parts constituting the first contact group, the second common contacts constituting the first common contact group being disposed on one side in a fourth direction relative to the second individual contacts constituting the second individual contact group, the fourth direction being a direction in parallel to the base and crossing the third direction; and a second common contact group of the second common contacts each connected to each of the first common contact parts constituting the second contact group, the second common contacts constituting the second common contact group being disposed on the other side in the fourth direction relative to the second individual contacts constituting the first individual contact group.

(11) In the actuator device according to the aspect (11), it is preferable that: the base has an edge; and the second individual contacts constituting the first individual contact group are disposed at positions closer to the edge than the second common contacts constituting the second common contact group to the edge. Preferably, the plurality of second individual wires is arranged on the surface of the base and includes: a first individual wire group of the second individual wires each connected to each of the second individual contacts constituting the first individual contact group; and a second individual wire group of the second individual wires each connected to each of the second individual contacts constituting the second individual contact group. Preferably, the second individual wires constituting the first individual wire group each extend from each of the second individual contacts constituting the first individual contact group in a direction away from the edge of the base so as to skirt around corresponding one of the second common contacts constituting the second common contact group.

(12) In the actuator device according to the aspect (10), it is preferable that: the surface of the base has an intermediate portion in the fourth direction; and the plurality of second individual contacts and the plurality of second common contacts are disposed at the intermediate portion. Preferably, the plurality of second individual wires includes: a first individual wire group of the second individual wires each connected to each of the second individual contacts constituting the first individual contact group; and a second individual wire group of the second individual wires each connected to each of the second individual contacts constituting the second individual contact group. Preferably, the second individual wires constituting the first individual wire group and the second individual wires constituting the second individual wire group extend in opposite directions from each other.

With the above-described configuration, since the second individual wires constituting the first individual wire group and the second individual wires constituting the second individual wire group extend in opposite directions from each other, the second individual wires constituting the first individual wire group can be extended linearly from the corresponding second individual contacts constituting the first individual contact group, without routing the second individual wires constituting the first individual wire group so as to skirt around the second common contacts constituting the first common contact group. Similarly, the second individual wires constituting the second individual wire group can be extended linearly from the corresponding second individual contacts constituting the second individual wire group, without routing the second individual wires constituting the second individual wire group so as to skirt around the second common contacts constituting the second common contact group.

(13) In the actuator device according to any one of the aspects (6), (10)-(12), preferably, the third direction is parallel to the first direction, and the fourth direction is parallel to the second direction.

With the above-described configuration, the plurality of first individual wires is arrayed in the first direction on the actuator, and the plurality of second individual contact is arrayed in the third direction parallel to the first direction on the wiring member. Further, in the actuator, the plurality of first individual wires is led out from the first electrodes in the second direction, and the base of the wiring member extends in the fourth direction parallel to the second direction. Accordingly, the actuator device configured by the actuator and the wiring member can be achieved through a simple construction.

(14) In the actuator device according to any one of the aspects (5), (6), (9)-(13), it is preferable that: the base has an opposite surface opposite to the surface of the base; the plurality of second individual wires is arranged on the surface of the base; the plurality of second common contacts is led onto the opposite surface from the surface of the base; and the second common wire is arranged on the opposite surface of the base.

(15) In the actuator device according to the aspect (5) or the aspect (9), it is preferable that: the base has an opposite surface opposite to the surface of the base; the plurality of second individual contacts is led onto the opposite surface from the surface of the base; and the plurality of second individual wires is arranged on the opposite surface of the base.

With the above-described configuration, the plurality of second individual wires is arranged on the opposite surface of the base on which the plurality of second common contacts is not arranged. Hence, this configuration enhances degree of freedom for routing the plurality of second individual wires.

(16) In the actuator device according to any one of the aspects (1)-(15), it is preferable that: the plurality of first individual wires is divided into a plurality of wire groups, each of the plurality of wire groups including two or more first individual wires; the first common contact includes a plurality of first common contact parts; and the plurality of first common contact parts is each positioned on an extension line extending from the first individual contact provided at one of the two or more first individual wires of each of the plurality of wire groups.

With the above-described configuration, even the configuration having the first common contact parts positioned only on the extension lines extending from the first individual contacts of some of the first individual wires can suppress variations in potential throughout the common electrode. Further, since fewer first common wires are used, the density of wires and contacts in the actuator can be reduced.

(17) In the actuator device according to any one of the aspects (1)-(16), preferably, the first common contact is arranged on a plane where the plurality of first individual contacts is arranged.

(18) In the actuator device according to the aspect (17), it is preferable that: each of the plurality of driving elements further includes a piezoelectric film disposed between the first electrode and the second electrode of the driving element; and the plurality of first individual contacts and the first common contact are disposed in areas remote from the piezoelectric films.

With the above-described configuration, the plurality of first individual contacts and the first common contact are arranged on the same plane in the area remote from the piezoelectric films. This arrangement makes it easier to connect the wiring member to the actuator.

(19) In the actuator device according to any one of the aspects (1)-(18), preferably, each of the plurality of first individual contacts and the first common contact define a separation distance therebetween in the second direction, the separation distance being greater than an interval between the neighboring first individual wires in the first direction.

With the above-described configuration, the separation distance between each of the plurality of first individual contacts and the first common contact in the second direction is set greater than the interval between the neighboring first individual wires in the first direction. This arrangement can prevent the risk of short-circuiting between the first individual wires and the first common contact.

(20) The actuator device according to any one of the aspects (1)-(19) may further include a protective member disposed on the actuator so as to cover the plurality of driving elements. Preferably, the plurality of first individual contacts and the first common contact are disposed in areas free from the protective member.

With the above-described configuration, the plurality of first individual contacts and the first common contact are arranged in the area not overlapped by the protective member. This arrangement enables the wiring member to be connected to the plurality of first individual contacts and the first common contact.

(21) In the actuator device according to any one of the aspects (1)-(20), preferably, the wiring member is bonded to the actuator by a non-conductive adhesive.

With the above-described configuration, the actuator and the wiring member are bonded together using the non-conductive adhesive. Accordingly, when the plurality of first individual contacts 53 and the first common contact are densely arranged on the actuator while the plurality of second individual contacts and the plurality of second common contacts are densely arranged on the wiring member, the non-conductive adhesive can prevent short-circuiting between the contacts.

What is claimed is:

1. An actuator device comprising:
   an actuator comprising:
   a plurality of driving elements each including a first electrode and a second electrode, the plurality of driving elements being arrayed in a first direction on a plane, the second electrodes being electrically connected to each other to provide a common electrode;
   a plurality of first individual wires each extending from each of the first electrodes in a second direction crossing the first direction and in parallel to the plane, the plurality of first individual wires being arrayed in the first direction at intervals between neighboring first individual wires;
   a plurality of first individual contacts each provided at a distal end portion of each of the plurality of first individual wires; and
   a first common contact extending from the common electrode and positioned on an extension line extending in the second direction from at least one of the plurality of first individual contacts; and
   a wiring member connected to the plurality of first individual contacts and the first common contact,
   wherein each of the plurality of first individual contacts and the first common contact define a separation distance therebetween in the second direction, the separation distance being greater than an interval between neighboring first individual contacts in the first direction.

2. The actuator device according to claim 1, wherein the plurality of driving elements includes a first row of the driving elements and a second row of the driving elements, the first row and the second row being juxtaposed with each other in the second direction, each of the driving elements constituting the first row being offset in the first direction from each of the driving elements constituting the second row,
   wherein the plurality of first individual wires includes:
      a first group of the first individual wires each extending from each of the first electrodes of the driving elements constituting the first row into an area between the first row and the second row; and
      a second group of the first individual wires each extending from each of the first electrodes of the driving elements constituting the second row into the area between the first row and the second row, and
   wherein the first individual wires constituting the first group and the first individual wires constituting the second group are arranged so as to be alternated with each other in the first direction.

3. The actuator device according to claim 1, wherein the plurality of first individual wires is divided into a plurality of wire groups, each of the plurality of wire groups including two or more first individual wires,
   wherein the first common contact includes a plurality of first common contact parts, and
   wherein the plurality of first common contact parts is each positioned on an extension line extending from the first individual contact provided at one of the two or more first individual wires of each of the plurality of wire groups.

4. The actuator device according to claim 1, wherein the first common contact is arranged on a plane where the plurality of first individual contacts is arranged.

5. The actuator device according to claim 4, wherein each of the plurality of driving elements further includes a piezoelectric film disposed between the first electrode and the second electrode of the driving element, and
   wherein the plurality of first individual contacts and the first common contact are disposed in areas remote from the piezoelectric films.

6. The actuator device according to claim 1, wherein each of the plurality of first individual contacts and the first common contact define a separation distance therebetween in the second direction, the separation distance being greater than an interval between the neighboring first individual wires in the first direction.

7. The actuator device according to claim 1, further comprising a protective member disposed on the actuator so as to cover the plurality of driving elements,
   wherein the plurality of first individual contacts and the first common contact are disposed in areas free from the protective member.

8. The actuator device according to claim 1, wherein the wiring member is bonded to the actuator by a non-conductive adhesive.

9. An actuator device comprising:
an actuator comprising:
a plurality of driving elements each including a first electrode and a second electrode, the plurality of driving elements being arrayed in a first direction on a plane, the second electrodes being electrically connected to each other to provide a common electrode;
a plurality of first individual wires each extending from each of the first electrodes in a second direction crossing the first direction and in parallel to the plane, the plurality of first individual wires being arrayed in the first direction at intervals between neighboring first individual wires;
a plurality of first individual contacts each provided at a distal end portion of each of the plurality of first individual wires; and
a first common contact extending from the common electrode and positioned on an extension line extending in the second direction from at least one of the plurality of first individual contacts; and
a wiring member connected to the plurality of first individual contacts and the first common contact,
wherein the plurality of driving elements includes a first row of the driving elements and a second row of the driving elements, the first row and the second row being juxtaposed with each other in the second direction, each of the driving elements constituting the first row being offset in the first direction from each of the driving elements constituting the second row,
wherein the plurality of first individual wires includes:
a first group of the first individual wires each extending from each of the first electrodes of the driving elements constituting the first row into an area between the first row and the second row; and
a second group of the first individual wires each extending from each of the first electrodes of the driving elements constituting the second row into the area between the first row and the second row, and
wherein the first individual wires constituting the first group and the first individual wires constituting the second group are arranged so as to be alternated with each other in the first direction
wherein the common electrode includes:
a first common electrode provided by the second electrodes of the driving elements constituting the first row electrically connected to each other; and
a second common electrode provided by the second electrodes of the driving elements constituting the second row electrically connected to each other,
the actuator device further comprising: a plurality of first common wires each extending from the first common electrode into the area between the first row and the second row,
wherein the first common contact includes a plurality of first common contact parts each being provided at a distal end portion of each of the plurality of first common wires and positioned on an extension line extending from one of the first individual contacts provided at the first individual wire constituting the second group.

10. The actuator device according to claim 9, wherein the plurality of first common contact parts is each positioned between neighboring first individual wires constituting the first group in the first direction.

11. The actuator device according to claim 9, wherein the wiring member comprises:
a base having a surface opposing the actuator;
a plurality of second individual contacts arranged on the surface of the base and each connected to each of the plurality of first individual contacts;
a plurality of second common contacts arranged on the surface of the base and each connected to each of the plurality of first common contact parts;
a plurality of second individual wires each connected to each of the plurality of second individual contacts; and
a second common wire connected to the plurality of second common contacts.

12. The actuator device according to claim 11, wherein the plurality of first common wires and the plurality of first common contact parts extend exclusively from the first common electrode,
wherein, on the surface of the base, the plurality of second individual contacts includes:
a first individual contact group of the second individual contacts each connected to each of the first individual contacts provided at the first individual wire constituting the first group; and
a second individual contact group of the second individual contacts each connected to each of the first individual contacts provided at the first individual wire constituting the second group, the second individual contacts constituting the first individual contact group and the second individual contacts constituting the second individual contact group being arrayed in a third direction, and
wherein, on the surface of the base, the plurality of second common contacts is disposed at a position juxtaposed with the second individual contacts constituting the second individual contact group in a fourth direction in parallel to the base and crossing the third direction.

13. The actuator device according to claim 12, wherein the third direction is parallel to the first direction, and the fourth direction is parallel to the second direction.

14. The actuator device according to claim 11, wherein the base has an opposite surface opposite to the surface of the base,
wherein the plurality of second individual wires is arranged on the surface of the base,
wherein the plurality of second common contacts is led onto the opposite surface from the surface of the base, and
wherein the second common wire is arranged on the opposite surface of the base.

15. The actuator device according to claim 11, wherein the base has an opposite surface opposite to the surface of the base,
wherein the plurality of second individual contacts is led onto the opposite surface from the surface of the base, and
wherein the plurality of second individual wires is arranged on the opposite surface of the base.

16. The actuator device according to claim 9,
wherein the number of the first common wires is equal to the number of the first individual wires constituting the second group, and
wherein the plurality of first common wires are provided in one to one correspondence with the plurality of first individual wires constituting the second group such that the first common contact part provided at the distal end portion of each first common wire is positioned on an extension line extending from the first individual contact provided at the corresponding first individual wire constituting the second group.

17. The actuator device according to claim 9,
wherein the number of the first common wires is smaller than the number of the first individual wires constituting the second group,
wherein the plurality of first individual wires constituting the second group is divided into a plurality of wire groups, each of the plurality of wire groups including two or more first individual wires, and
wherein the plurality of first common contact parts is each positioned on an extension line extending from the first individual contact provided at one of the two or more first individual wires of each of the plurality of wire groups.

18. An actuator device comprising:
an actuator comprising:
   a plurality of driving elements each including a first electrode and a second electrode, the plurality of driving elements being arrayed in a first direction on a plane, the second electrodes being electrically connected to each other to provide a common electrode;
   a plurality of first individual wires each extending from each of the first electrodes in a second direction crossing the first direction and in parallel to the plane, the plurality of first individual wires being arrayed in the first direction at intervals between neighboring first individual wires;
   a plurality of first individual contacts each provided at a distal end portion of each of the plurality of first individual wires; and
   a first common contact extending from the common electrode and positioned on an extension line extending in the second direction from at least one of the plurality of first individual contacts; and
a wiring member connected to the plurality of first individual contacts and the first common contact,
wherein the plurality of driving elements includes a first row of the driving elements and a second row of the driving elements, the first row and the second row being juxtaposed with each other in the second direction, each of the driving elements constituting the first row being offset in the first direction from each of the driving elements constituting the second row,
wherein the plurality of first individual wires includes:
   a first group of the first individual wires each extending from each of the first electrodes of the driving elements constituting the first row into an area between the first row and the second row; and
   a second group of the first individual wires each extending from each of the first electrodes of the driving elements constituting the second row into the area between the first row and the second row, and
wherein the first individual wires constituting the first group and the first individual wires constituting the second group are arranged so as to be alternated with each other in the first direction
wherein the common electrode includes:
   a first common electrode provided by the second electrodes of the driving elements constituting the first row electrically connected to each other; and
   a second common electrode provided by the second electrodes of the driving elements constituting the second row electrically connected to each other, the actuator device further comprising: a plurality of first common wires including:
   a first common wire group of the first common wires each extending from the first common electrode into the area between the first row and the second row; and
   a second common wire group of the first common wires each extending from the second common electrode into the area between the first row and the second row,
wherein the first common contact includes: a plurality of first common contact parts, the plurality of first common contact parts including:
   a first contact group of the first common contact parts each provided at a distal end portion of each of the first common wires constituting the first common wire group and positioned on an extension line extending from one of the first individual contacts provided at the first individual wire constituting the second group; and
   a second contact group of the first common contact parts each provided at a distal end portion of each of the first common wires constituting the second common wire group and positioned on an extension line extending from one of the first individual contacts provided at the first individual wire constituting the first group.

19. The actuator device according to claim 18, wherein the first individual contacts each provided at each of the first individual wires constituting the first group and the first common contact parts constituting the first contact group are alternated with each other in the first direction to form a first contact row,
wherein the first individual contacts each provided at each of the first individual wires constituting the second group and the first common contact parts constituting the second contact group are alternated with each other in the first direction to form a second contact row, and
wherein the first contact row and the second contact row are arranged juxtaposed with each other in the second direction.

20. The actuator device according to claim 18, wherein the wiring member comprises:
   a base having a surface opposing the actuator;
   a plurality of second individual contacts arranged on the surface of the base and each connected to each of the plurality of first individual contacts;
   a plurality of second common contacts arranged on the surface of the base and each connected to each of the plurality of first common contact parts;
   a plurality of second individual wires each connected to each of the plurality of second individual contacts; and
   a second common wire connected to the plurality of second common contacts.

21. The actuator device according to claim 9, wherein, on the surface of the base,
   the plurality of second individual contacts includes:
      a first individual contact group of the second individual contacts each connected to each of the first individual contacts provided at the first individual wire constituting the first group; and
      a second individual contact group of the second individual contacts each connected to each of the first individual contacts provided at the first individual wire constituting the second group, the second individual contacts constituting the first individual contact group and the second individual contacts constituting the second individual contact group being arrayed in a third direction, and wherein, on the surface of the base, the plurality of second common contacts includes:

a first common contact group of the second common contacts each connected to each of the first common contact parts constituting the first contact group, the second common contacts constituting the first common contact group being disposed on one side in a fourth direction relative to the second individual contacts constituting the second individual contact group, the fourth direction being a direction in parallel to the base and crossing the third direction; and a second common contact group of the second common contacts each connected to each of the first common contact parts constituting the second contact group, the second common contacts constituting the second common contact group being disposed on the other side in the fourth direction relative to the second individual contacts constituting the first individual contact group.

22. The actuator device according to claim 21, wherein the base has an edge, wherein the second individual contacts constituting the first individual contact group are disposed at positions closer to the edge than the second common contacts constituting the second common contact group to the edge, wherein the plurality of second individual wires is arranged on the surface of the base and includes:

a first individual wire group of the second individual wires each connected to each of the second individual contacts constituting the first individual contact group; and a second individual wire group of the second individual wires each connected to each of the second individual contacts constituting the second individual contact group, and wherein the second individual wires constituting the first individual wire group each extend from each of the second individual contacts constituting the first individual contact group in a direction away from the edge of the base so as to skirt around corresponding one of the second common contacts constituting the second common contact group.

23. The actuator device according to claim 21, wherein the surface of the base has an intermediate portion in the fourth direction, wherein the plurality of second individual contacts and the plurality of second common contacts are disposed at the intermediate portion, wherein the plurality of second individual wires includes:

a first individual wire group of the second individual wires each connected to each of the second individual contacts constituting the first individual contact group; and a second individual wire group of the second individual wires each connected to each of the second individual contacts constituting the second individual contact group, and wherein the second individual wires constituting the first individual wire group and the second individual wires constituting the second individual wire group extend in opposite directions from each other.

24. An actuator device comprising:

an actuator comprising;

a plurality of driving elements each including a first electrode and a second electrode, the plurality of driving elements including a first row of the driving elements and a second row of the driving elements, the first row and the second row extending in a first direction on a plane and being juxtaposed with each other in a second direction crossing the first direction and in parallel to the plane, the second electrodes of the driving elements constituting the first row being electrically connected to each other to provide a first common electrode, the second electrodes of the driving elements constituting the second row being electrically connected to each other to provide a second common electrode;

a plurality of first individual wires including:

a first wire row of the first individual wires extending in the first direction, the first individual wires in the first wire row being arrayed in the first direction at intervals between neighboring first individual wires and each extending in the second direction from each of the first electrodes of the driving elements constituting the first row into an area between the first row and the second row; and a second wire row of the first individual wires extending in the first direction, the first individual wires in the second wire row being arrayed in the first direction at intervals between neighboring first individual wires and each extending in the second direction from each of the first electrodes of the driving elements constituting the second row into the area between the first row and the second row;

a plurality of first individual contacts including:

a first contact row of the first individual contacts each provided at a distal end portion of each of the first individual wires in the first wire row; and a second contact row of the first individual contacts each provided at a distal end portion of each of the first individual wires in the second wire row; and a plurality of first common contacts each extending from the first common electrode into the area between the first row and the second row and positioned on an extension line extending in the second direction from one of the first individual contacts in the second contact row; and a wiring member connected to the plurality of first individual contacts and the plurality of first common contacts.

25. The actuator device according to claim 24 wherein the plurality of first common contacts and the plurality of first individual contacts in the second contact row define a separation distance therebetween in the second direction, the separation distance being greater than an interval between neighboring first individual contacts in the first direction.

* * * * *